(12) United States Patent
Ohmae et al.

(10) Patent No.: US 8,435,880 B2
(45) Date of Patent: May 7, 2013

(54) METHOD FOR MANUFACTURING SEMICONDUCTOR DEVICE AND SEMICONDUCTOR DEVICE

(75) Inventors: Akira Ohmae, Kanagawa (JP); Kota Tokuda, Kanagawa (JP); Masayuki Arimochi, Kanagawa (JP); Nobuhiro Suzuki, Miyagi (JP); Michinori Shiomi, Kanagawa (JP); Tomonori Hino, Tokyo (JP); Katsunori Yanashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 207 days.

(21) Appl. No.: 12/906,217

(22) Filed: Oct. 18, 2010

(65) Prior Publication Data

US 2011/0095401 A1  Apr. 28, 2011

(30) Foreign Application Priority Data

Oct. 26, 2009  (JP) .................................. 2009-245160

(51) Int. Cl.
*H01L 33/00* (2010.01)
(52) U.S. Cl.
USPC  438/604; 257/64; 257/E29.004; 257/E33.023; 257/94; 438/46
(58) Field of Classification Search ............... 438/604
See application file for complete search history.

(56) References Cited

U.S. PATENT DOCUMENTS

2006/0043396 A1*  3/2006  Tsuda et al. .................... 257/94

OTHER PUBLICATIONS

H. Amano et al.; Metalorganic vapor phase epitaxial growth of a high quality GaN film using an AlN buffer layer; Applied Physics Letters; 48 (5); Feb. 3, 1986.
Isamu Akasaki et al.; Effects on AlN Buffer Layer on Crystallographic Structure and on electrical and Optical Properties of GaN and Ga Films Grown on Sapphire Substrate by MOVPE; Journal of Crystal Growth; 98; 1989.
Tetsuya Takeuchi et al.; Growth of single crystalline GaN film on Si substrate using 3C-SiC as an intermediate layer; Journal of Crystal Growth; 115; 1991.
Isamu Akasaki; Progress in crystal growth of nitride semiconductors; Journal of Crystal Growth; 221; 2000.
Hiroshi Amano et al.; Effect of low-temperature-deposited layer on the growth of group III nitrides on sapphire; Oyo Buturi; 68; 768; 1999.

* cited by examiner

*Primary Examiner* — Michelle Mandala
*Assistant Examiner* — Shaka White
(74) *Attorney, Agent, or Firm* — Dentons US LLP

(57) ABSTRACT

In a method for manufacturing a semiconductor device, the method includes the step of growing a nitride-based III-V compound semiconductor layer, which forms a device structure, directly on a substrate without growing a buffer layer, the substrate being made of a material with a hexagonal crystal structure and having a principal surface that is oriented off at an angle of not less than −0.5° and not more than 0° from an R-plane with respect to a direction of a C-axis.

10 Claims, 36 Drawing Sheets

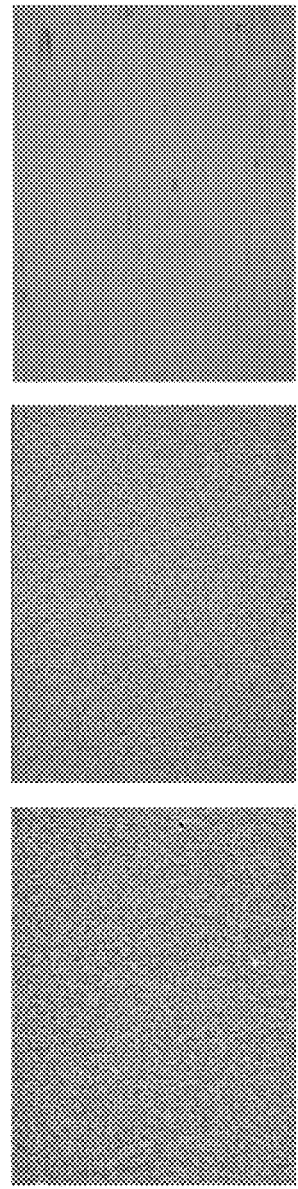
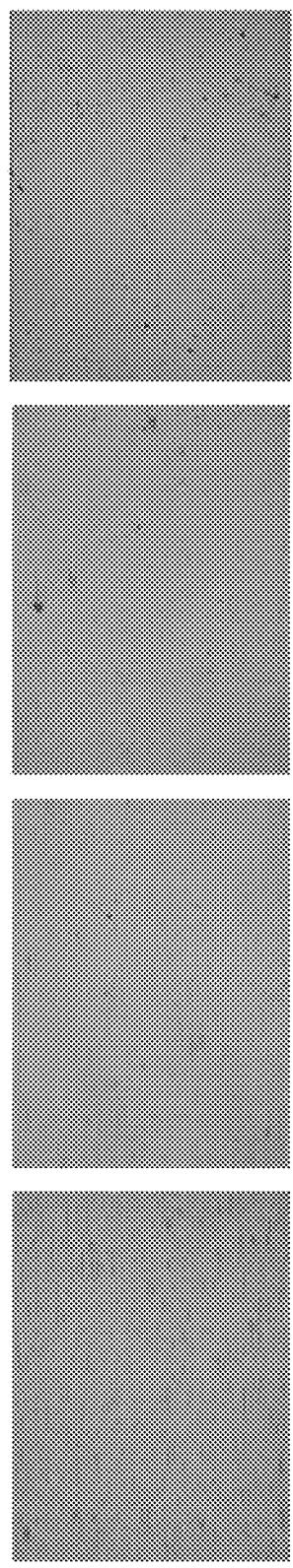
FIG. 13A −0.7°
FIG. 13B −0.5°
FIG. 13C −0.2°
FIG. 13D 0°
FIG. 13E +0.2°
FIG. 13F +0.5°
FIG. 13G +0.7°

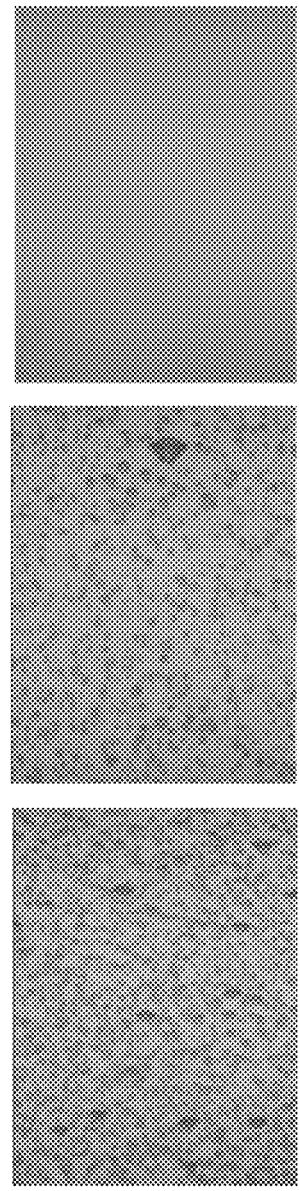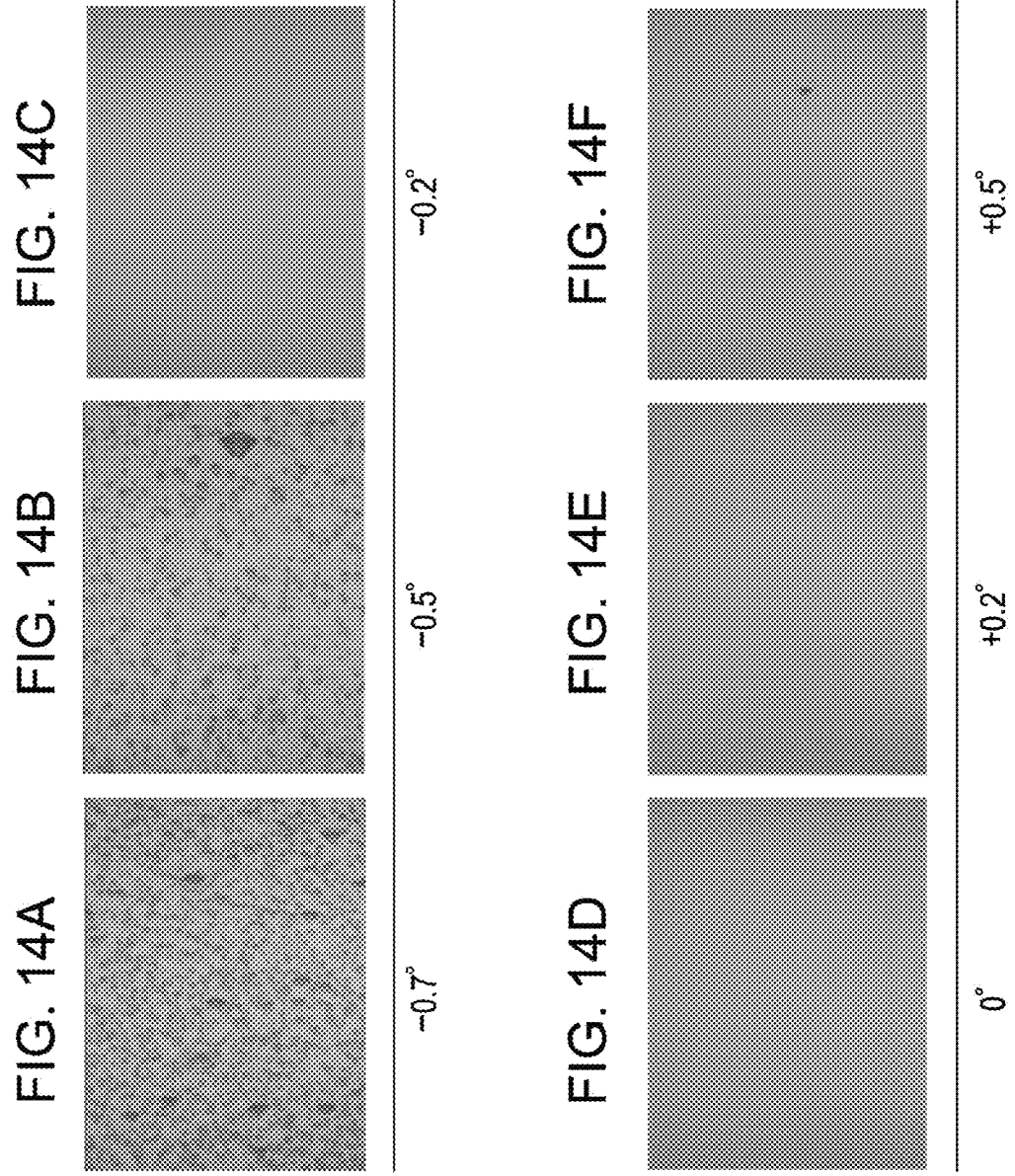
FIG. 14A −0.7°
FIG. 14B −0.5°
FIG. 14C −0.2°
FIG. 14D 0°
FIG. 14E +0.2°
FIG. 14F +0.5°
FIG. 14G +0.7°

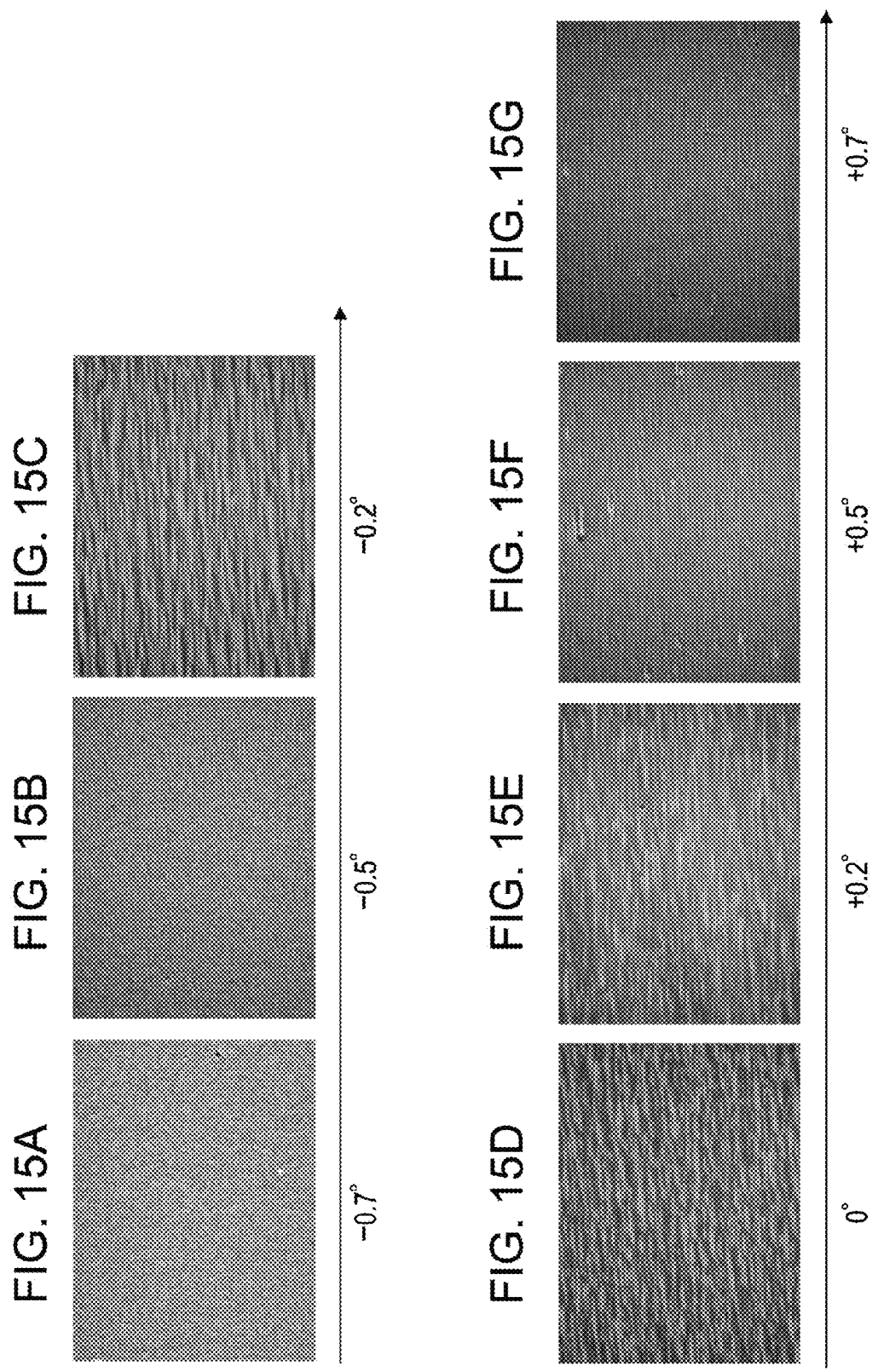

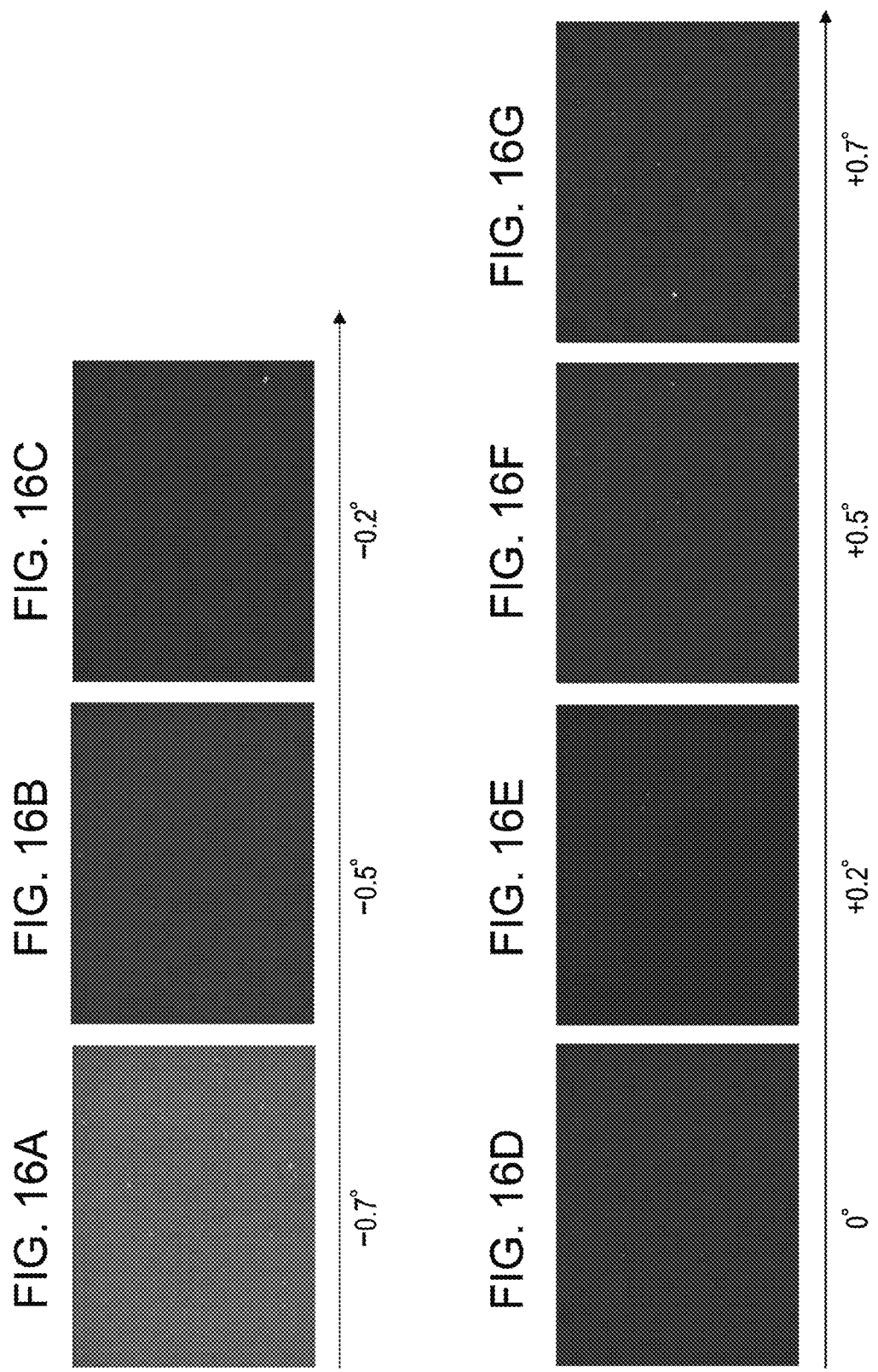

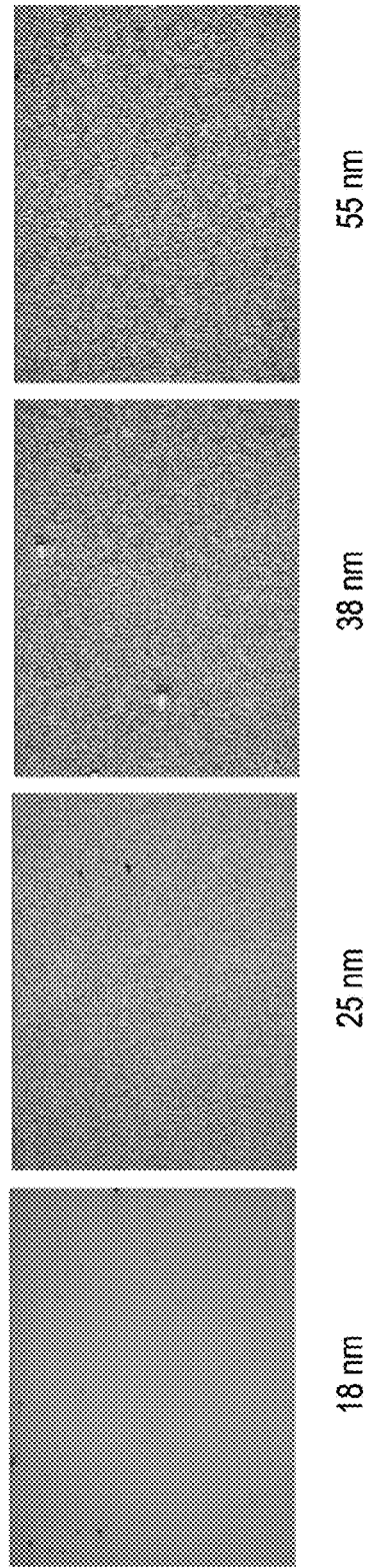

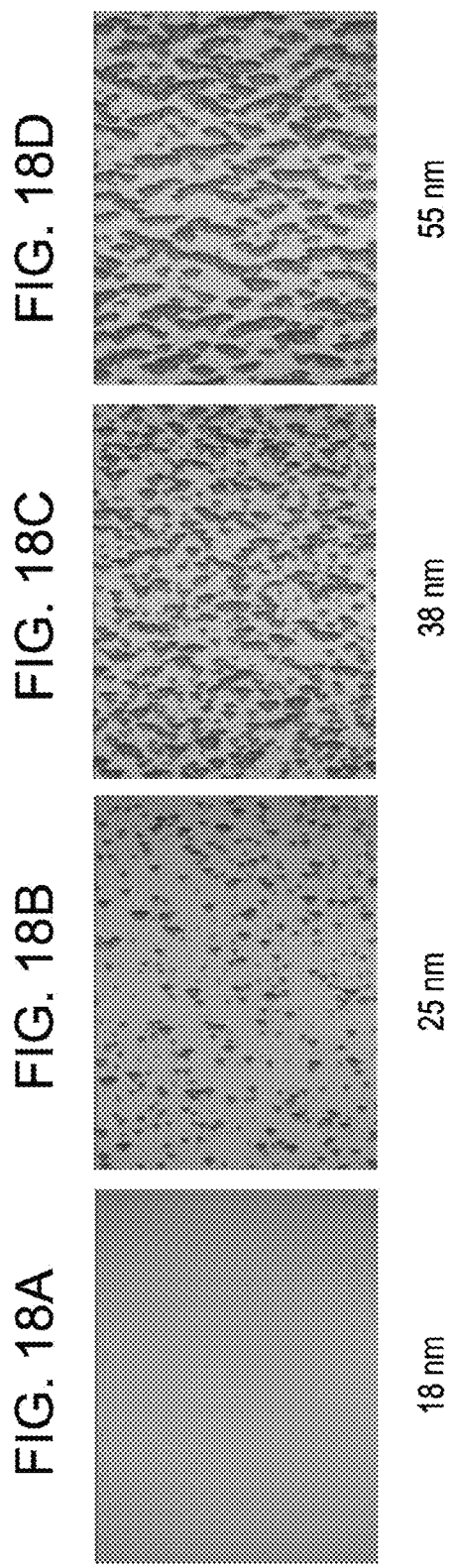

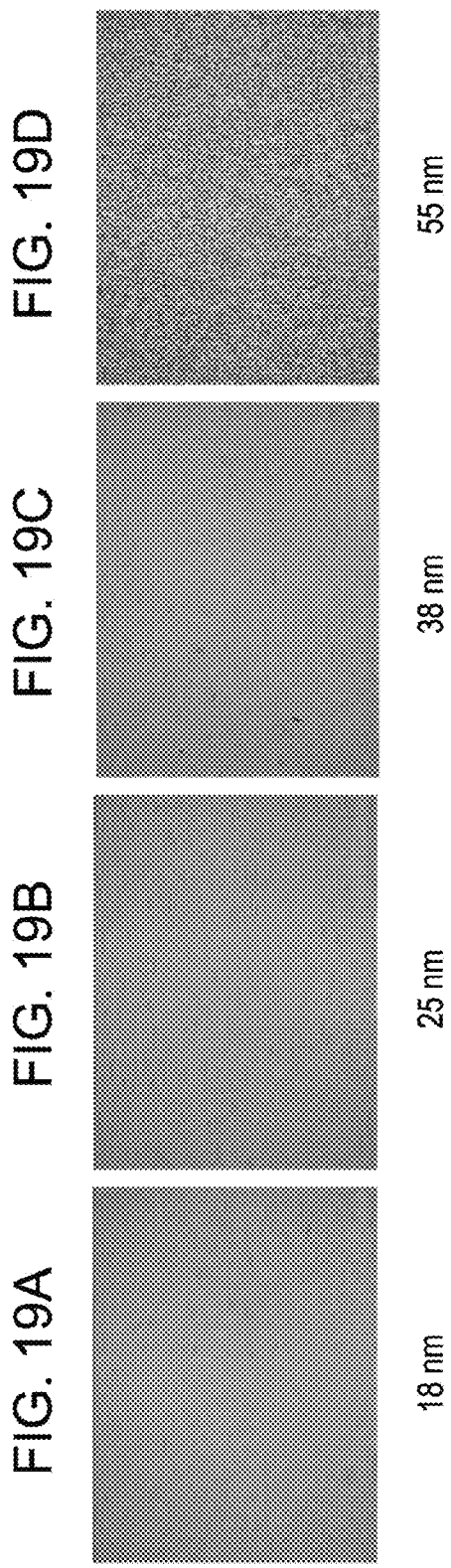

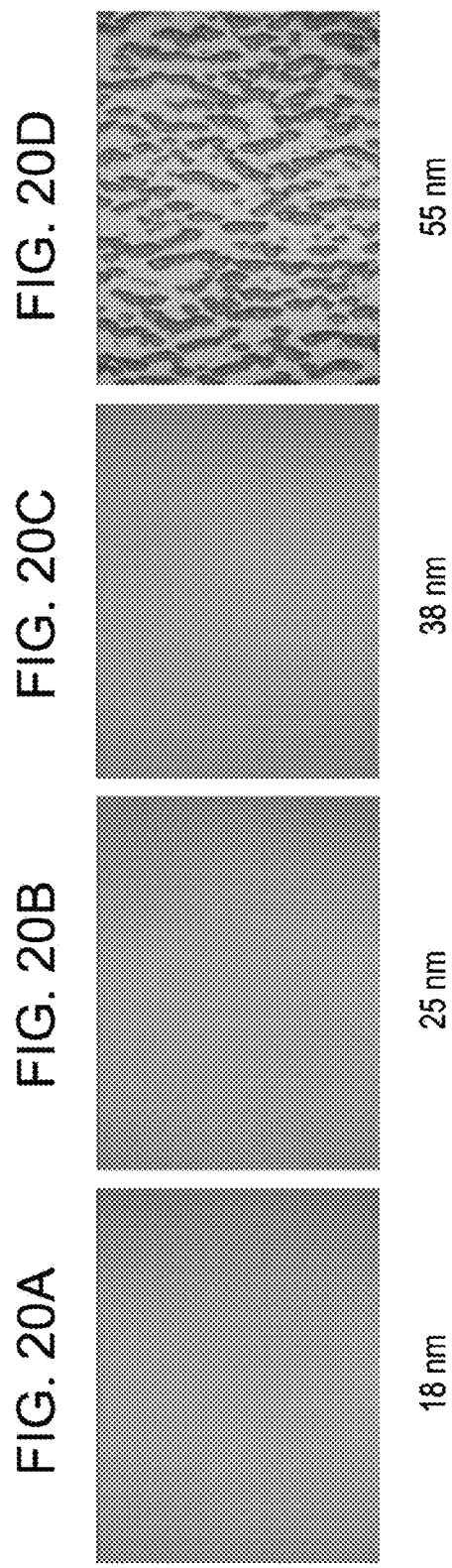

500 μm

500 μm

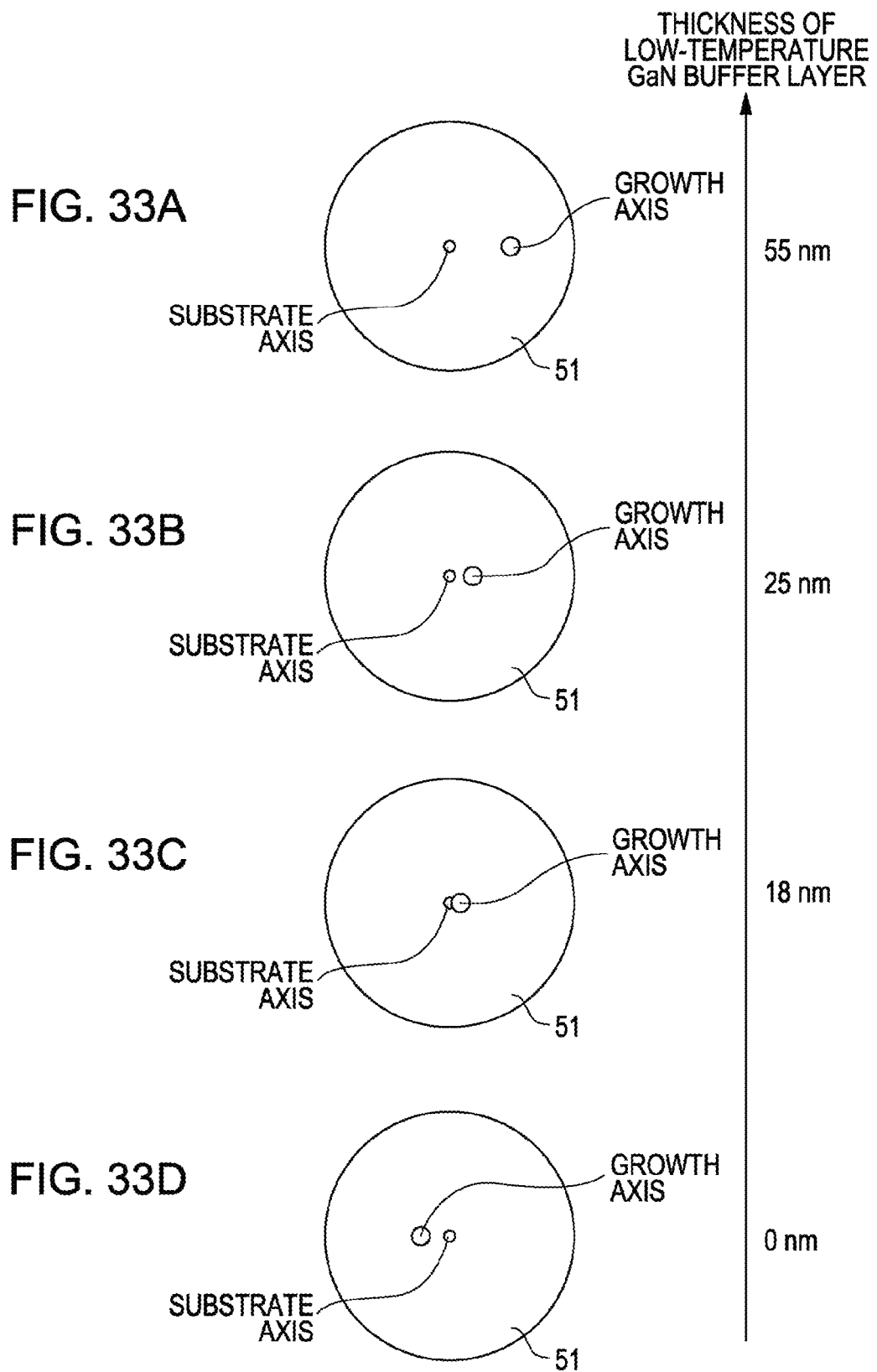

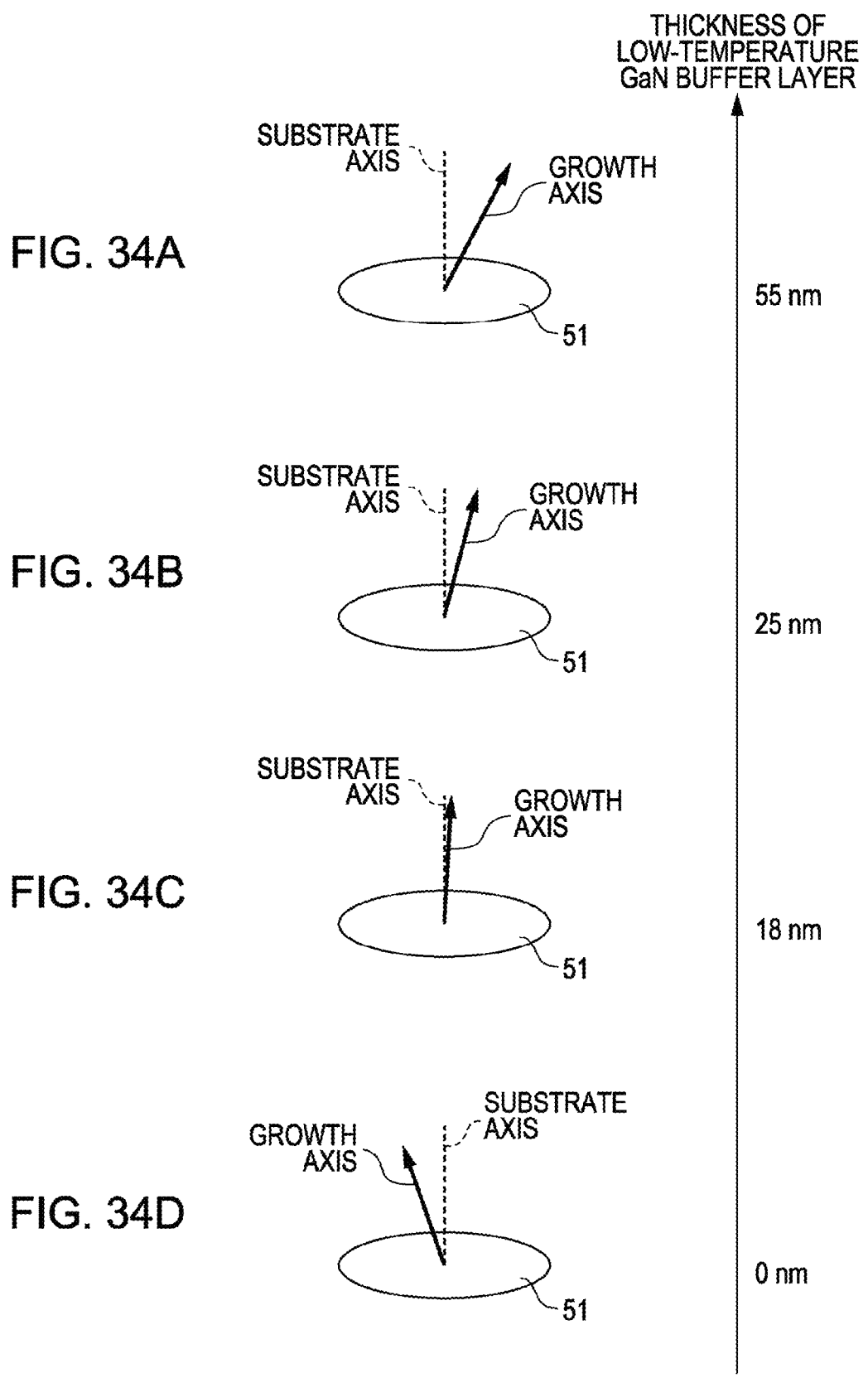

METHOD FOR MANUFACTURING SEMICONDUCTOR DEVICE AND SEMICONDUCTOR DEVICE

BACKGROUND OF THE INVENTION

1. Field of the Invention

The present invention relates to a method for manufacturing a semiconductor device and to a semiconductor device. The present invention is suitably applied to a semiconductor device, such as a light emitting diode using a nitride-based III-V compound semiconductor, for example.

2. Description of the Related Art

When crystal growth of a nitride-based III-V compound semiconductor, e.g., a GaN-based semiconductor, forming a device structure, is developed on a sapphire substrate, it has hitherto been general to first grow a buffer layer, which is made of GaN or AlN, on the substrate (see, for example, H. Amano et al., Appl. Phys. Lett. 48,353(1986); I. Akasaki et al., J. Cryst. Growth 98,209(1989); K. Hiramatsu et al., J. Cryst. Growth 115,628(1991); Hiroshi Amano and Isamu Akasaki, *OYO BUTURI* (Applied Physics) 68,768(1999); and I. Akasaki, J. Cryst. Growth 221,231(2000)). By growing a nitride-based III-V compound semiconductor layer after growing the buffer layer on the sapphire substrate, as described in those documents, threading dislocation generated in the nitride-based III-V compound semiconductor layer can be reduced even when lattice mismatching between the sapphire substrate and the nitride-based III-V compound semiconductor is large. As a result, the nitride-based III-V compound semiconductor layer having a flat surface and good crystallinity can be obtained.

SUMMARY OF THE INVENTION

Growing the buffer layer before the growth of the nitride-based III-V compound semiconductor layer forming the device structure, as mentioned above, increases the number of steps for manufacturing a semiconductor device, and hence such a process is not desired from the viewpoint of simplifying the manufacturing steps. Under the present situation, however, there is a difficulty in obtaining the nitride-based III-V compound semiconductor layer having a flat surface and good crystallinity by growing the nitride-based III-V compound semiconductor layer, which forms the device structure, without growing the buffer layer.

Accordingly, it is desirable to provide a semiconductor device manufacturing method capable of growing a nitride-based III-V compound semiconductor layer, which has a flat surface and good crystallinity and which forms a device structure, on a substrate, such as a sapphire substrate, without growing a buffer layer.

It is also desirable to provide a semiconductor device which can be manufactured by using the semiconductor device manufacturing method.

The semiconductor device manufacturing method and the semiconductor device will be apparent from the following description with reference to the attached drawings.

According to an embodiment of the present invention, there is provided a method for manufacturing a semiconductor device, the method including the step of growing a nitride-based III-V compound semiconductor layer, which forms a device structure, directly on a substrate without growing a buffer layer, the substrate being made of a material with a hexagonal crystal structure and having a principal surface that is oriented off at an angle of not less than −0.5° and not more than 0° from an R-plane with respect to a direction of a C-axis.

According to another embodiment of the present invention, there is provided a semiconductor device including a substrate made of a material with a hexagonal crystal structure and having a principal surface that is oriented off at an angle of not less than −0.5° and not more than 0° from an R-plane with respect to a direction of a C-axis, and a nitride-based III-V compound semiconductor layer grown directly on the substrate without growing a buffer layer, and forming a device structure.

According to still another embodiment of the present invention, there is provided an electronic apparatus using a semiconductor device including a substrate made of a material with a hexagonal crystal structure and having a principal surface that is oriented off at an angle of not less than −0.5° and not more than 0° from an R-plane with respect to a direction of a C-axis, and a nitride-based III-V compound semiconductor layer grown directly on the substrate without growing a buffer layer, and forming a device structure.

According to still another embodiment of the present invention, there is provided a substrate made of a material with a hexagonal crystal structure and having a principal surface that is oriented off at an angle of not less than −0.5° and not more than 0° from an R-plane with respect to a direction of a C-axis.

In the present invention, a positive or negative off-angle of the principal surface, i.e., an off-angle of "the principal surface that is oriented off at an angle of not less than −0.5° and not more than 0° from an R-plane with respect to a direction of a C-axis", is defined as illustrated in FIGS. 42A and 42B. FIG. 42A illustrates several crystal planes and crystal orientations of a crystal with a hexagonal crystal structure, and FIG. 42B is a sectional view looking at the crystal illustrated in FIG. 42A from a direction perpendicular to an A-plane ((11-20) plane) that is perpendicular to an R-plane ((1-102) plane) thereof. As illustrated in FIG. 42B, the negative (−) off-angle is represented by a direction in which, in a plane parallel to the A-plane and including the C-axis ([0001]), the direction of a line normal to the principal surface of the substrate comes closer to the direction of the C-axis than the direction of a line normal to the R-plane, i.e., than the direction of an R-axis. The positive (+) off-angle is represented by a direction in which it goes farther away from the direction of the C-axis than the aforesaid direction.

The nitride-based III-V compound semiconductor layer is generally made of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$). More concretely, the nitride-based III-V compound semiconductor layer is made of $Al_xB_yGa_{1-x-y-z}In_zN$ (where $0 \leq x \leq 1$, $0 \leq y \leq 1$, $0 \leq z \leq 1$, and $0 \leq x+y+z<1$). Typically, the nitride-based III-V compound semiconductor layer is made of $Al_xGa_{1-x-y}In_zN$ (where $0 \leq x \leq 1$, $0 \leq y \leq 1$, and $0 \leq z \leq 1$). Practical examples of the nitride-based III-V compound semiconductor layer include GaN, InN, AlN, AlGaN, InGaN, and AlGaInN. Preferably, the nitride-based III-V compound semiconductor layer is made of GaN, $In_xGa_{1-x}N$ ($0<x<0.5$), $Al_xGa_{1-x}N$ ($0<x<0.5$), or $Al_xIn_yGa_{1-x-y}N$ ($0<x<0.5$ and $0<y<0.2$).

Various epitaxial growth processes can be used to grow the nitride-based III-V compound semiconductor layer and one of those processes is selected depending on the case applied. For example, Metal-Organic Chemical Vapor Deposition (MOCVD), Hydride Vapor Phase Epitaxy or Halide Vapor Phase Epitaxy (HVPE), and Molecular Beam Epitaxy (MBE) are usable.

The substrate made of the material with the hexagonal crystal structure may be, for example, a substrate made of sapphire, SiC (including 6H and 4H), α-ZnS, or ZnO. Further, the relevant substrate may be a substrate made of a nitride-based III-V compound semiconductor (such as GaN, AlGaInN, AlN, or GaInN). As an alternative, the substrate may be prepared by growing a material with the hexagonal crystal structure on a substrate that is made of a material differing from the material with the hexagonal crystal structure.

The semiconductor device may be, for example, a light emitting device including a light emitting diode, a semiconductor laser, etc., or an electron transit device. The electron transit device may be, for example, a transistor including a Field Effect Transistor (FET) such as an electron high-mobility transistor, and a bipolar transistor such as a Heterojunction Bipolar Transistor (HBT). Be it, however, noted that the electron transit device is not limited to those examples. In addition, the semiconductor device may be a light emitting device such as a photodiode, a sensor, a solar cell, etc.

The electronic apparatus may be in any forms so long as the apparatus uses the semiconductor device, and it includes both the portable type and the stationary type. Practical examples of the electronic apparatus using the light emitting device include a light emitting diode backlight (such as a backlight for a liquid crystal display), a light emitting diode illuminator, and a light emitting diode display. Other examples of the electronic apparatus include a projector, a rear projection television, and a grating light valve (GLV) each of which uses a light emitting diode as a light source. Still other examples of the electronic apparatus include a cellular phone, mobile equipment, a robot, a personal computer, vehicle-loaded equipment, and various domestic electrical appliances.

For example, in a backlight, an illuminator, a display, a light-source cell unit, etc. in which a red light emitting device, a green light emitting device, and a blue light emitting device are each arrayed in plural number on a substrate or the like, the light emitting device formed of the above-described semiconductor device can be used as at least one of the red light emitting device, the green light emitting device, and the blue light emitting device. The red light emitting device may be formed as a device using an AlGaInP-based semiconductor, for example.

On the other hand, if a nitride-based III-V compound semiconductor layer having a flat surface and good crystallinity and forming a device structure can be grown on a substrate, e.g., a sapphire substrate, just by growing a very thin low-temperature buffer layer in advance, it is possible to minimize a load of manufacturing steps of the semiconductor device, and to obtain a similar advantage to that obtained with the case of not growing the buffer layer. Such a demand can be realized with still another embodiment of the present invention, which will be described below. Be it noted that the points described in connection with the foregoing embodiments of the present invention can also be applied to the following embodiment of the present invention so long as those points are not contradictory to the features of the following embodiment.

According to the still another embodiment of the present invention, there is provided a method for manufacturing a semiconductor device, the method including the step of growing a low-temperature GaN buffer layer on a substrate made of a material with a hexagonal crystal structure and having a principal surface that is oriented off at an angle of not less than −0.1° and not more than 0.5° from an R-plane with respect to a direction of a C-axis, and thereafter growing a nitride-based III-V compound semiconductor layer forming a device structure, wherein, assuming an off-angle of the substrate to be $\theta(°)$ and a thickness of the low-temperature GaN buffer layer to be t (nm), (t, $\theta$) falls within a region on a t$\theta$-plane, which is defined by inequalities given blow:

$\theta \leq 0.031t - 0.063$ $\theta \geq 0.016t - 0.1$ $\theta \leq 0.5$ $\theta \geq -0.1$ $t > 0$ The region defined by the above inequalities is indicated by a hatched region in FIG. 41. A manner of deducing those inequalities is described in detail later.

According to still another embodiment of the present invention, there is provided a semiconductor device including a substrate made of a material with a hexagonal crystal structure and having a principal surface that is oriented off at an angle of not less than −0.1° and not more than 0.5° from an R-plane with respect to a direction of a C-axis, a low-temperature GaN buffer layer grown on the substrate, and a nitride-based III-V compound semiconductor layer grown on the low-temperature GaN buffer layer and forming a device structure, wherein, assuming an off-angle of the substrate to be $\theta(°)$ and a thickness of the low-temperature GaN buffer layer to be t (nm), (t, $\theta$) falls within a region on a t$\theta$-plane, which is defined by inequalities given blow:

$\theta \leq 0.031t - 0.063$ $\theta \geq 0.016t - 0.1$ $\theta \leq 0.5$ $\theta \geq -0.1$ $t > 0$ According to still another embodiment of the present invention, there is provided an electronic apparatus using a semiconductor device including a substrate made of a material with a hexagonal crystal structure and having a principal surface that is oriented off at an angle of not less than −0.1° and not more than 0.5° from an R-plane with respect to a direction of a C-axis, a low-temperature GaN buffer layer grown on the substrate, and a nitride-based III-V compound semiconductor layer grown on the low-temperature GaN buffer layer and forming a device structure, wherein, assuming an off-angle of the substrate to be $\theta(°)$ and a thickness of the low-temperature GaN buffer layer to be t (nm), (t, $\theta$) falls within a region on a t$\theta$-plane, which is defined by inequalities given blow:

$\theta \leq 0.031t - 0.063$ $\theta \geq 0.016t - 0.1$ $\theta \leq 0.5$ $\theta \geq -0.1$ $t > 0$ According to the embodiment of the present invention described above, by properly selecting the surface orientation of the substrate, the nitride-based III-V compound semiconductor layer having the flat surface and good crystallinity can be grown without growing the buffer layer.

Further, according to the embodiment of the present invention described above, by properly selecting the surface orientation of the substrate and properly selecting the thickness of the low-temperature GaN buffer layer, the nitride-based III-V compound semiconductor layer having the flat surface and good crystallinity can be grown just by growing the very thin low-temperature GaN buffer layer.

With the embodiment of the present invention, the nitride-based III-V compound semiconductor layer, which has the flat surface and good crystallinity and which forms the device structure of the semiconductor device, can be grown on the substrate, such as the sapphire substrate, without growing the buffer layer. The semiconductor device having good characteristics can also be realized by using the nitride-based III-V compound semiconductor layer thus grown. Further, various types of electronic apparatuses, including a high-performance backlight, an illuminator, and a display, can be realized with the use of the semiconductor device having good characteristics.

In addition, with the embodiment of the present invention, the nitride-based III-V compound semiconductor layer, which has the flat surface and good crystallinity and which forms the device structure of the semiconductor device, can be grown just by growing the very-thin low-temperature GaN buffer layer in advance. The semiconductor device having good characteristics can also be realized by using the nitride-based III-V compound semiconductor layer thus grown. Further, various types of electronic apparatuses, including a high-performance backlight, an illuminator, and a display, can be realized with the use of the semiconductor device having good characteristics.

BRIEF DESCRIPTION OF THE DRAWINGS

FIGS. 13A to 13G are photographs, substituted for views, representing optical microscope images (×5) of surfaces of GaN layers grown on sapphire substrates, which have various off-angles, according to the fifth embodiment of the present invention with interposition of a low-temperature GaN buffer layer having a thickness of 19 nm therebetween;

FIGS. 14A to 14G are photographs, substituted for views, representing optical microscope images (×100) of the surfaces of the GaN layers grown on the sapphire substrates, which have various off-angles, according to the fifth embodiment of the present invention with interposition of the low-temperature GaN buffer layer having the thickness of 19 nm therebetween;

FIGS. 15A to 15G are photographs, substituted for views, representing optical-microscope differential interference images of the surfaces of the GaN layers grown on the sapphire substrates, which have various off-angles, according to the fifth embodiment of the present invention with interposition of the low-temperature GaN buffer layer having the thickness of 19 nm therebetween;

FIGS. 16A to 16G are photographs, substituted for views, representing fluorescence images of the surfaces of the GaN layers grown on the sapphire substrates, which have various off-angles, according to the fifth embodiment of the present invention with interposition of the low-temperature GaN buffer layer having the thickness of 19 nm therebetween;

FIGS. 17A to 17D are photographs, substituted for views, representing optical microscope images (×5) of surfaces of GaN layers grown on sapphire substrates, each of which has the off-angle of 0.2°, according to the fifth embodiment of the present invention with interposition of each of low-temperature GaN buffer layers having various thicknesses therebetween;

FIGS. 18A to 18D are photographs, substituted for views, representing optical microscope images (×100) of the surfaces of the GaN layers grown on the sapphire substrates, each of which has the off-angle of 0.2°, according to the fifth embodiment of the present invention with interposition of each of low-temperature GaN buffer layers having various thicknesses therebetween;

FIGS. 19A to 19D are photographs, substituted for views, representing optical microscope images (×5) of surfaces of GaN layers grown on sapphire substrates, each of which has the off-angle of 0.5°, according to the fifth embodiment of the present invention with interposition of each of low-temperature GaN buffer layers having various thicknesses therebetween;

FIGS. 20A to 20D are photographs, substituted for views, representing optical microscope images (×100) of the surfaces of the GaN layers grown on the sapphire substrates, each of which has the off-angle of 0.5°, according to the fifth embodiment of the present invention with interposition of each of low-temperature GaN buffer layers having various thicknesses therebetween;

FIGS. 33A to 33D are illustrations to explain a tilt, with respect to the substrate axis, of a growth axis of each of the GaN layers grown on the sapphire substrates, each of which has the off-angle of 0.2°, according to the fifth embodiment of the present invention with interposition of each of the low-temperature GaN buffer layers having various thicknesses therebetween;

FIGS. 34A to 34D are illustrations to explain the tilt, with respect to the substrate axis, of the growth axis of each of the GaN layers grown on the sapphire substrates, each of which has the off-angle of 0.2°, according to the fifth embodiment of the present invention with interposition of each of the low-temperature GaN buffer layers having various thicknesses therebetween;

DESCRIPTION OF THE PREFERRED EMBODIMENTS

Embodiments of the present invention will be described below. The following description is made in the sequence listed below.
1. First embodiment (a method for manufacturing a semiconductor device and a semiconductor device)
2. Second embodiment (method for manufacturing a light emitting diode and a light emitting diode)
3. Third embodiment (a method for manufacturing a light emitting diode backlight and a semiconductor light emitting diode backlight)
4. Fourth embodiment (a method for manufacturing a light emitting diode backlight and a semiconductor light emitting diode backlight)
5. Fifth embodiment (a method for manufacturing a semiconductor device and a semiconductor device)

<1. First Embodiment>
[Method for Manufacturing Semiconductor Device and Semiconductor device]

Figure 1:
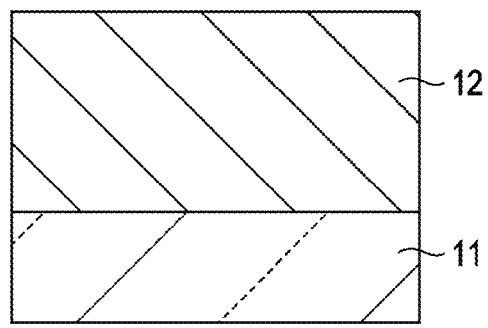
FIG. 1 is a sectional view to explain a method for manufacturing a semiconductor device according to a first embodiment of the present invention.
Figure 2:
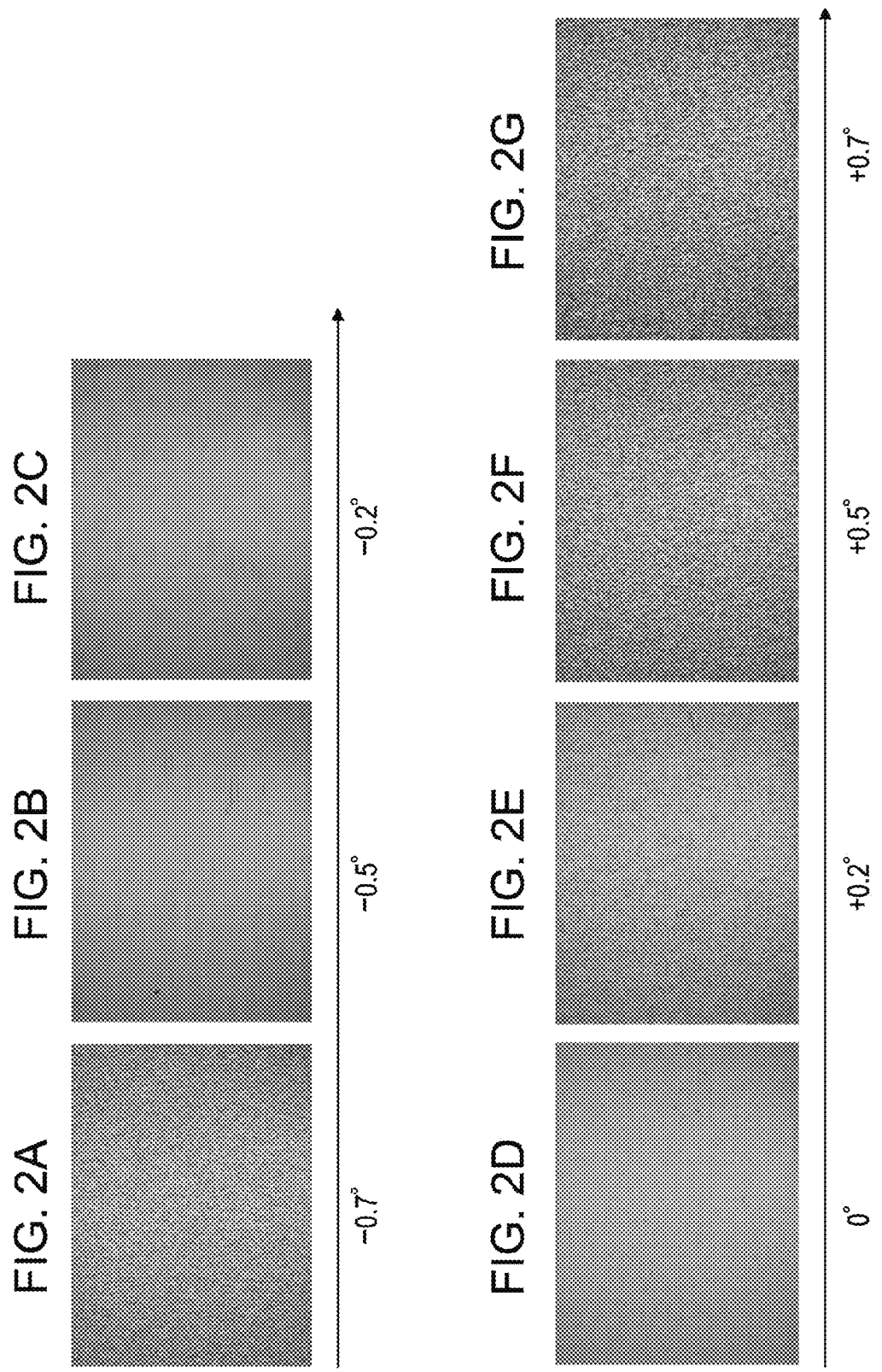
FIGS. 2A to 2G are photographs, substituted for views, representing optical microscope images (×5) of surfaces of GaN layers grown on sapphire substrates, which have various off-angles, according to the first embodiment of the present invention.
Figure 3:
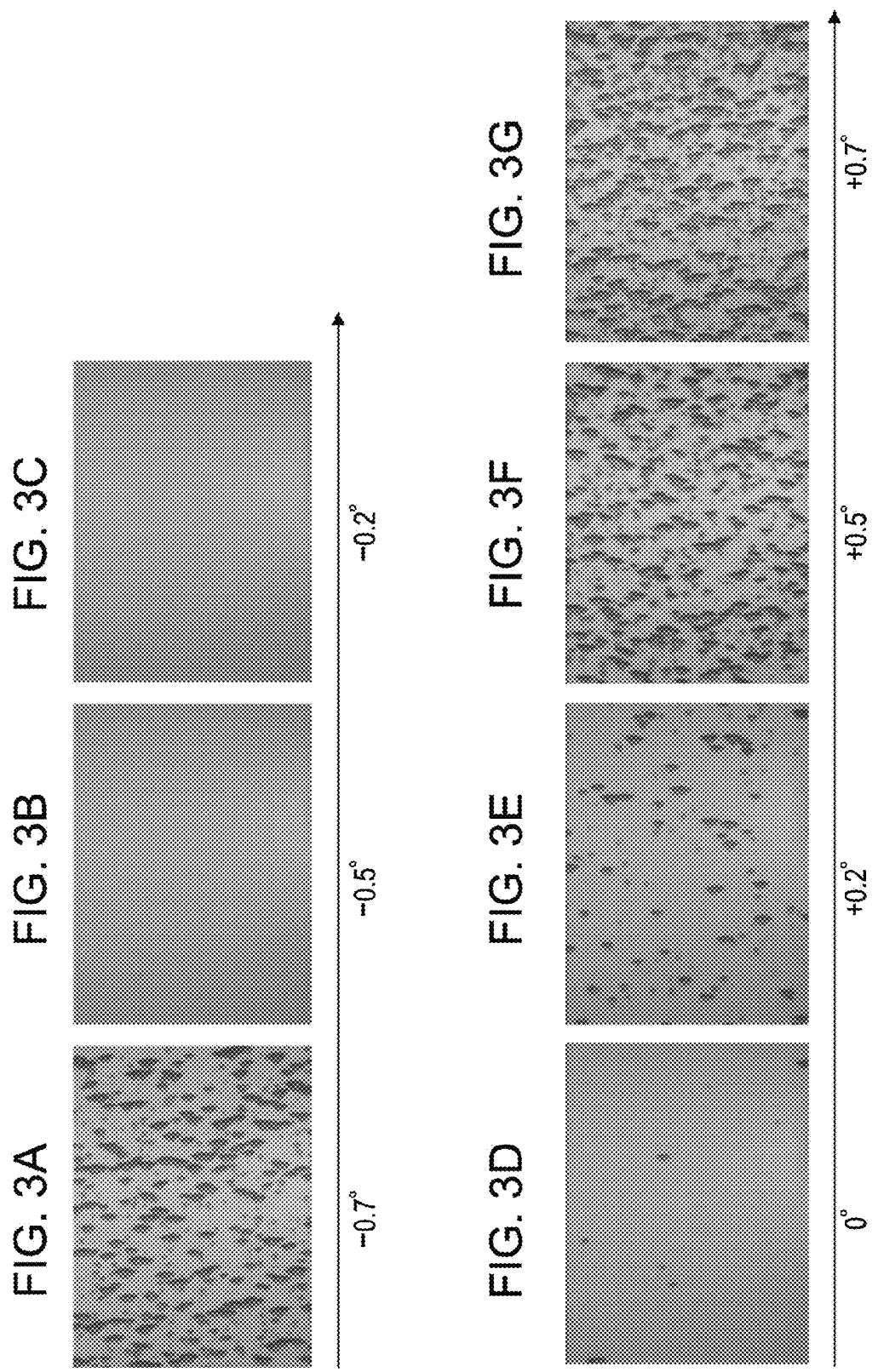
FIGS. 3A to 3G are photographs, substituted for views, representing optical microscope views (×100) of the surfaces of the GaN layers grown on the sapphire substrates, which have various off-angles, according to the first embodiment of the present invention.
Figure 4:
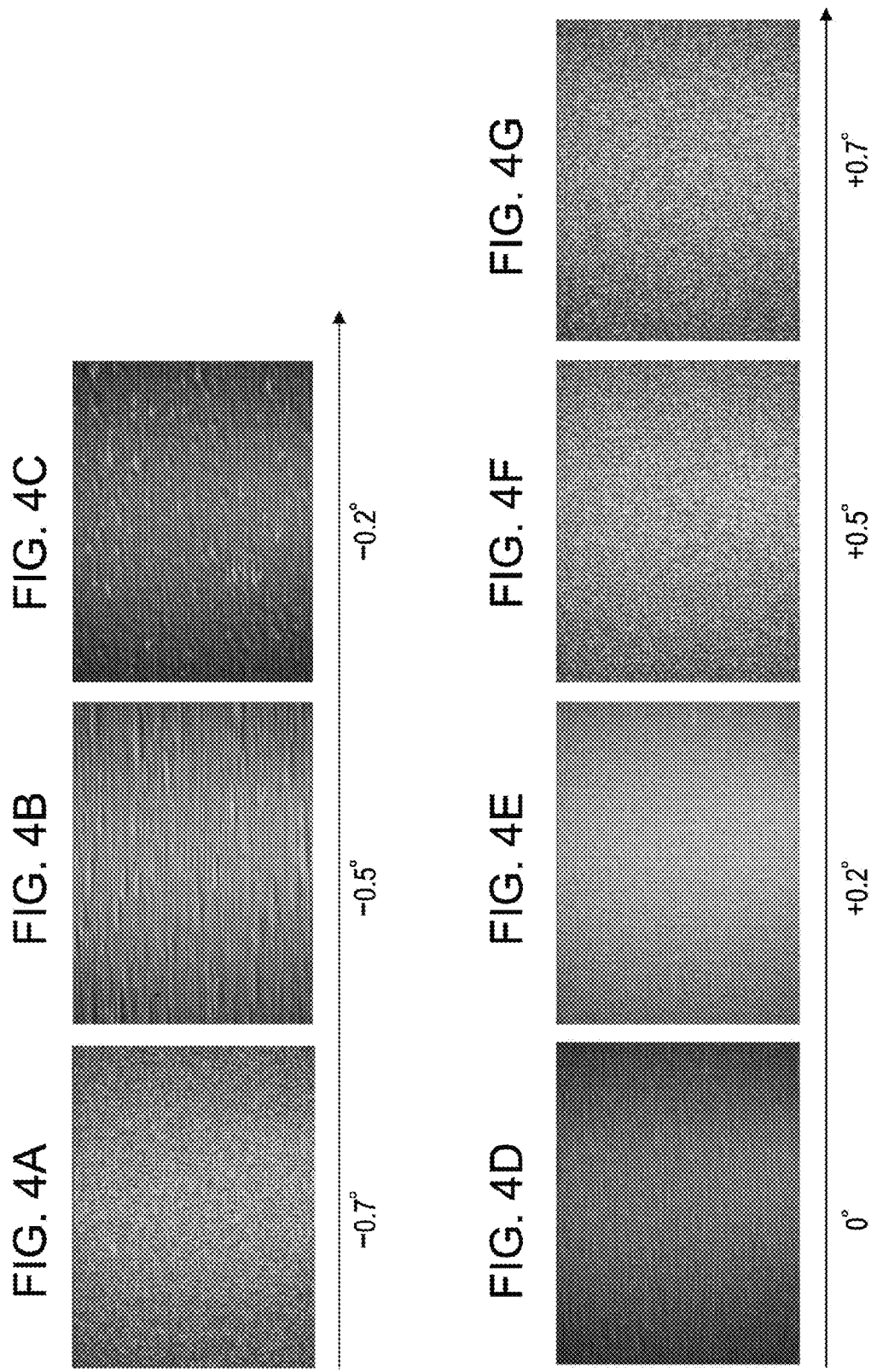
FIGS. 4A to 4G are photographs, substituted for views, representing optical-microscope differential interference images of the surfaces of the GaN layers grown on the sapphire substrates, which have various off-angles, according to the first embodiment of the present invention.
Figure 5:
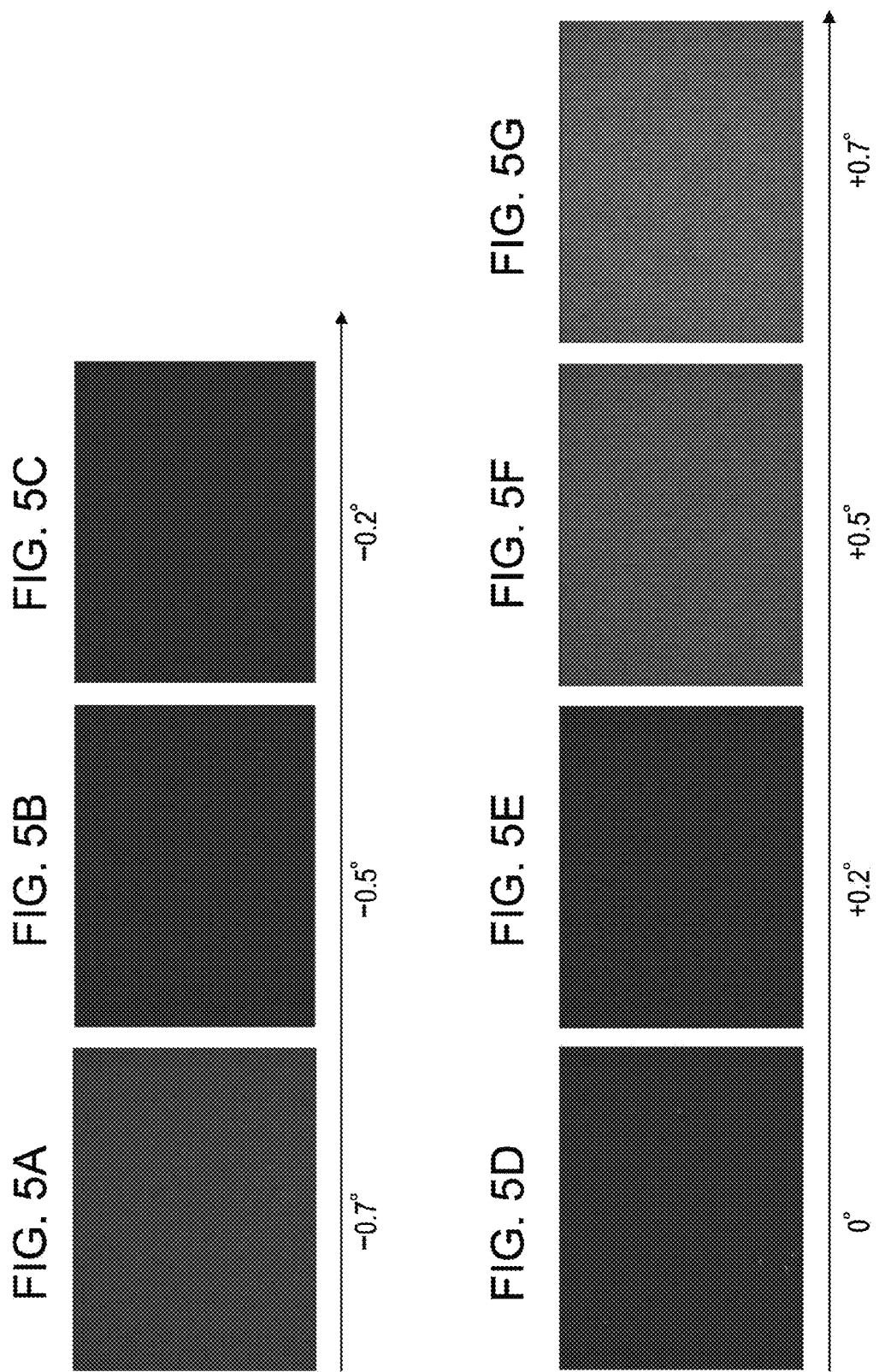
FIGS. 5A to 5G are photographs, substituted for views, representing fluorescence images of the surfaces of the GaN layers grown on the sapphire substrates, which have various off-angles, according to the first embodiment of the present invention.

In a first embodiment, as illustrated in FIG. 1, a sapphire substrate 11 having a principal surface, which is oriented off at an angle of not less than −0.5° and not more than 0° from an R-plane with respect to the direction of a C-axis, is prepared and the surface of the sapphire substrate 11 is cleaned by thermal cleaning, for example, with a usual method.

Next, a nitride-based III-V compound semiconductor layer 12 forming a device structure is grown directly on the cleaned surface of the sapphire substrate 11 without growing a buffer layer. For example, an MOCVD process is used to grow the nitride-based III-V compound semiconductor layer 12.

Growth conditions of the nitride-based III-V compound semiconductor layer 12 are, for example, as follows. The growth rate is 0.5 to 8 μm/hour, the flow rate of a III element material (such as trimethylgallium ($(CH_3)_3Ga$, TMG), trimethylaluminum ($(CH_3)_3Al$, TMA), or trimethylindium ($(CH_3)_3In$, TMI)) is 10 to 200 sccm, the flow rate of a nitrogen material (e.g., ammonia ($NH_3$)) is 5 to 30 slm, the growth temperature is 950 to 1250° C., a V/III ratio of the growth materials is 1000 to 15000, and the growth pressure is 0.01 to 1 atm.

Individual layers constituting the nitride-based III-V compound semiconductor layer 12 is designed as appropriate depending on a semiconductor device to be manufactured. For example, when the semiconductor device is a light emitting diode, the nitride-based III-V compound semiconductor layer 12 has an active layer (light emitting layer), an n-side cladding layer, and a p-side cladding layer, the latter two layers sandwiching the active layer. When the semiconductor device is a semiconductor laser, the nitride-based III-V compound semiconductor layer 12 has an active layer, an n-side cladding layer, and a p-side cladding layer, the latter two layers sandwiching the active layer, or it has an active layer, optical waveguide layers sandwiching the active layer, an n-side cladding layer, and a p-side cladding layer, the latter two layers sandwiching the optical waveguide layer. When the semiconductor device is an electron transit device, e.g., a field effect transistor, the nitride-based III-V compound semiconductor layer 12 has an electron transit layer (channel layer), etc. Practical examples of the layers constituting the nitride-based III-V compound semiconductor layer 12 include a GaN layer, an AlGaN layer, an AlGaInN layer, and an InGaN layer.

After growing the nitride-based III-V compound semiconductor layer 12, the nitride-based III-V compound semiconductor layer 12 is processed by etching, etc. depending on the case applied, and necessary electrodes (not shown) are then formed.

An objective semiconductor device is manufactured as described above.

EXAMPLE 1

Sapphire substrates 11 having off-angles changed in seven levels, i.e., −0.7°, −0.5°, −0.2°, 0°, +0.2°, +0.5° and +0.7°, relative to the R-plane were prepared. Then, samples were fabricated by directly growing a GaN layer in a thickness of 3.5 μm on each of the prepared sapphire substrates 11 with the MOCVD process without growing a buffer layer.

FIGS. 2A to 2G represent optical microscope images (bright field images) (×5) of surfaces of the samples prepared by growing the GaN layers directly on the sapphire substrates 11, which have the off-angles of −0.7°, −0.5°, −0.2°, 0°, +0.2°, +0.5° and +0.7°, without forming the buffer layer. Further, FIGS. 3A to 3G represent optical microscope images (bright field images) (×100) of surfaces of the samples prepared by growing the GaN layers directly on the sapphire substrates 11, which have the off-angles of −0.7°, −0.5°, −0.2°, 0°, +0.2°, +0.5° and +0.7°, without forming the buffer layer. As seen from FIGS. 2A to 2G and FIGS. 3A to 3G, the surfaces of the GaN layers grown directly on the sapphire substrates 11, which have the off-angles of −0.5°, −0.2° and 0°, without growing the buffer layer, are flat and exhibit good crystallinity. On the other hand, the surfaces of the GaN layers grown directly on the sapphire substrates 11, which have the off-angles of −0.7°, +0.2°, +0.5° and +0.7°, without growing the buffer layer, are inferior in both flatness and crystallinity. Herein, the crystallinity of the GaN layer can be determined from a density of pits generated due to such a phenomenon that dislocations occurred in the GaN layer starting from the interface between the GaN layer and the sapphire substrate 11 thread through the GaN layer until its surface, thus causing the so-called threading dislocations. Also, the flatness of the surface of the CaN layer can be determined from confirming that no patterns appear on the optical microscope image.

FIGS. 4A to 4G represent optical-microscope differential interference images (×5) of surfaces of the samples prepared by growing the GaN layers on the sapphire substrates 11, which have the off-angles of −0.7°, −0.5°, −0.2°, 0°, +0.2°, +0.5° and +0.7°, without growing the buffer layer. As seen from FIGS. 4A to 4G, the surfaces of the GaN layers grown on the sapphire substrates 11 having the off-angles of −0.5°, −0.2° and 0° are flat and exhibit good crystallinity. On the other hand, the surfaces of the GaN layers grown on the sapphire substrates 11 having the off-angles θ of −0.7°, +0.2°, +0.5° and +0.7° are inferior in both flatness and crystallinity.

FIGS. 5A to 5G represent fluorescence images of surfaces of the samples prepared by growing the GaN layers on the sapphire substrates 11, which have the off-angles of −0.7°, −0.5°, −0.2°, 0°, +0.2°, +0.5° and +0.7°, without forming the buffer layer. As seen from FIGS. 5A to 5G, the surfaces of the GaN layers grown on the sapphire substrates 11 having the off-angles θ of −0.5°, −0.2° and 0° are flat and exhibit good crystallinity. On the other hand, the surfaces of the GaN layers grown on the sapphire substrates 11 having the off-angles θ of −0.7°, +0.2°, +0.5° and +0.7° are inferior in both flatness and crystallinity.

As seen from FIGS. 2A to 2G, FIGS. 3A to 3G, FIGS. 4A to 4G, and FIGS. 5A to 5G, the surfaces of the GaN layers are superior in both flatness and crystallinity when the sapphire substrates 11 have the off-angles of not less than −0.5° and not more than 0°.

According to the first embodiment, as described above, the sapphire substrate 11 having the principal surface, which is oriented off at an angle of not less than −0.5° and not more than 0° from the R-plane with respect to the direction of the C-axis, is used. As a result, the nitride-based III-V compound semiconductor layer 12 having the flat surface and good crystallinity and forming the device structure can be grown on the sapphire substrate 11 without growing the buffer layer. Further, a semiconductor device having good characteristics can be manufactured by using the nitride-based III-V compound semiconductor layer 12 thus grown. In addition, since this method for manufacturing the semiconductor device does not include the step of growing the buffer layer, the manufacturing steps can be simplified and hence the manufacturing cost can be reduced.

<2. Second Embodiment>

[Light Emitting Diode and Method for Manufacturing the Same]

Figure 6:
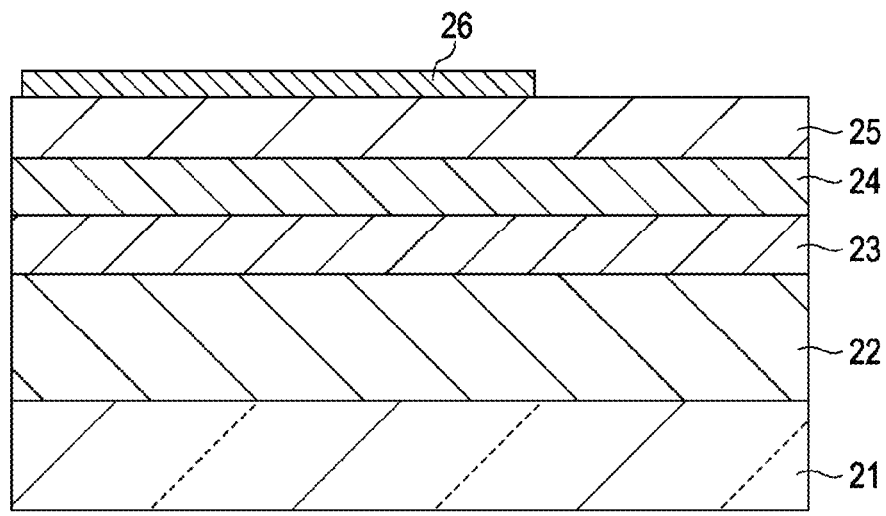
FIG. 6 is a sectional view to explain a method for manufacturing a light emitting diode according to a second embodiment of the present invention.

In a second embodiment, as illustrated in FIG. 6, a sapphire substrate 21 having a principal surface, which is oriented off at an angle of not less than −0.5° and not more than 0° from an R-plane with respect to the direction of a C-axis, is prepared and the surface of the sapphire substrate 21 is cleaned by thermal cleaning, for example, with a usual method.

Next, a nitride-based III-V compound semiconductor layer forming a light emitting diode structure is grown directly on the cleaned surface of the sapphire substrate 21 without growing a buffer layer. More specifically, by way of example, an n-type nitride-based III-V compound semiconductor layer 22, another n-type nitride-based III-V compound semiconductor layer 23, an active layer 24 using a nitride-based III-V compound semiconductor, and a p-type nitride-based III-V compound semiconductor layer 25 are successively grown on the sapphire substrate 21. The MOCVD process is used, for example, to grow the n-type nitride-based III-V compound semiconductor layer 22, the n-type nitride-based III-V compound semiconductor layer 23, the active layer 24, and the p-type nitride-based III-V compound semiconductor layer 25.

Next, the sapphire substrate 21 on which the nitride-based based III-V compound semiconductor layers forming the light emitting diode structure have been grown is taken out from an MOCVD apparatus.

Next, a p-side electrode 26 is formed on the p-type nitride-based III-V compound semiconductor layer 25. The P-side electrode 26 is preferably made of an ohmic metal that has a high reflectivity for light having the emission wavelength.

Thereafter, heat treatment is performed to activate p-type impurities in the p-type nitride-based III-V compound semiconductor layer 25. The heat treatment is performed, for example, in an atmosphere of mixed gas of $N_2$ and $O_2$ (with a composition of, e.g., 990 of $N_2$ and 1% of $O_2$) at temperature of 550 to 750° C. (e.g., 650° C.) or 580 to 620° C. (e.g., 600° C.). Here, the activation is made more apt to occur by, as one example, mixing $O_2$ in $N_2$. As another example, nitrogen halide (e.g., $NF_3$ or $NCl_3$) may be mixed, as a material (e.g., F or Cl) having high electrical negativity similar to that of O or N, in an atmosphere of $N_2$ or mixed gas of $N_2$ and $O_2$. A time period of the heat treatment is, e.g., 5 minutes to 2 hours, or 40 minutes to 2 hours. Generally, the heat treatment time is about 10 to 60 minutes. The reason why the temperature of the heat treatment is set to be relatively low resides in preventing degradation of the active layer 24, etc. during the heat treatment. Be it noted that the heat treatment may be performed before the p-side electrode 26 is formed after growing the p-type nitride-based III-V compound semiconductor layer 25.

Figure 7:
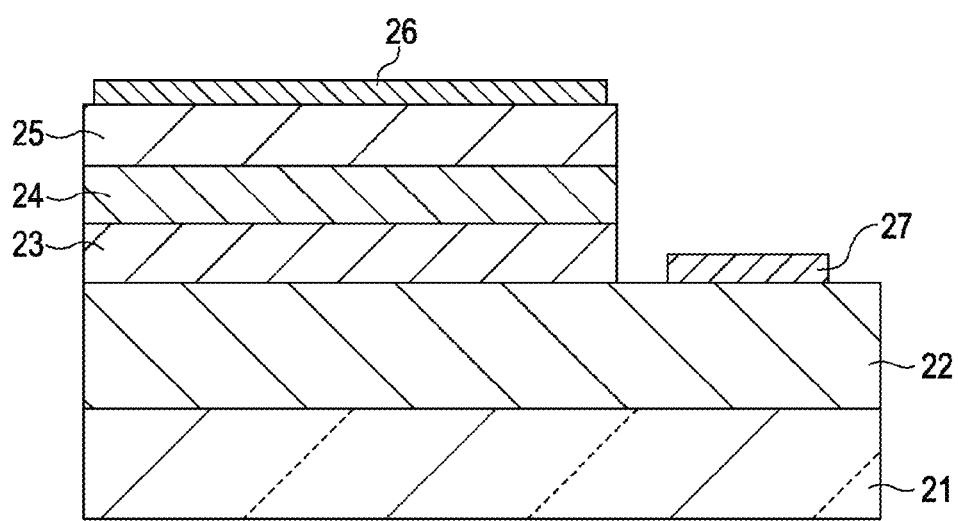
FIG. 7 is a sectional view to explain the method for manufacturing the light emitting diode according to the second embodiment of the present invention.

Next, as illustrated in FIG. 7, the n-type nitride-based III-V compound semiconductor layer 23, the active layer 24, and the p-type nitride-based III-V compound semiconductor layer 25 are patterned into a predetermined shape by reactive ion etching (RIE), powder blasting, or sand blasting, for example, thereby forming a mesa portion.

Next, an n-side electrode 27 is formed on a portion of the n-type nitride-based III-V compound semiconductor layer 22, which is adjacent to the mesa portion.

Next, the thickness of the sapphire substrate 21 on which the light emitting diode structure has been formed as described above, is reduced by grinding or lapping the rear side of the sapphire substrate 21 if necessary. Thereafter, the sapphire substrate 21 is subjected to scribing to form bars. The bars are further subjected to scribing to form chips.

An objective light emitting diode is manufactured as described above.

An example of a concrete structure of the light emitting diode will be described below. The n-type nitride-based III-V compound semiconductor layer 22 is, e.g., an n-type GaN layer. The n-type nitride-based III-V compound semiconductor layer 23 is made up of an n-type GaN layer and an n-type GaInN layer, which are laminated in this order from the lower side. The p-type nitride-based III-V compound semiconductor layer 25 is made up of a p-type AlInN layer, a p-type GaN layer, and a p-type GaInN layer, which are laminated in this order from the lower side. The active layer 24 has, e.g., a GaInN multi-quantum well (MQW) structure (that is formed, for example, by alternately laminating a GaInN quantum well layer and a GaN barrier layer). An In composition in the active layer 24 is selected depending on the emission wavelength of the light emitting diode. For example, the In composition is about 11% when the emission wavelength is 405 nm, about 18% when the emission wavelength is 450 nm, and about 24% when the emission wavelength is 520 nm. The p-side electrode 26 is made of, e.g., Ag or Pd/Ag. Depending on the case applied, a barrier metal, such as Ti, W, Cr, WN, or CrN, may be used in addition to the above-mentioned material. The n-side electrode 27 is of, e.g., a Ti/Pt/Au structure.

According to the second embodiment, since the sapphire substrate 21 having the principal surface, which is oriented off at an angle of not less than −0.5° and not more than 0° from the R-plane with respect to the direction of the C-axis, is used, the n-type nitride-based III-V compound semiconductor layers 22 and 23, the active layer 24, and the p-type nitride-based III-V compound semiconductor layer 25, each having the flat surface and good crystallinity and forming the light emitting diode structure, can be grown on the sapphire substrate 21 without growing the buffer layer. Therefore, a light emitting diode having good characteristics can be manufactured by using the n-type nitride-based III-V compound semiconductor layers 22 and 23, the active layer 24, and the p-type nitride-based III-V compound semiconductor layer 25. In addition, since this method for manufacturing the light emitting diode does not include the step of growing the low-temperature buffer layer, the manufacturing steps can be simplified and hence the manufacturing cost can be reduced.

<3. Third Embodiment>

[Light Emitting Diode Backlight and Method for Manufacturing the Same]

A third embodiment is described in connection with the case where a light emitting diode backlight is manufactured by using, in addition to a blue light emitting diode and a green light emitting diode which are obtained with the manufacturing method according to the second embodiment, a red light emitting diode which is separately prepared. For example, an AlGaInP light emitting diode is used as the red light emitting diode.

A light emitting diode structure for emitting blue light is formed on the sapphire substrate 21 by using the manufacturing method according to the second embodiment, for example, and a bump (not shown) is formed on each of the p-type electrode 26 and the n-type electrode 27. Thereafter, the sapphire substrate 21 is divided into chips to obtain the blue light emitting diode in the form of a flip chip. Likewise, the green light emitting diode is obtained in the form of a flip chip. On the other hand, the red light emitting diode is provided as an AlGaInP light emitting diode in the form of a chip, which is obtained through the steps of laminating an AlGaInP semiconductor layer on an n-type GaAs substrate to form a light emitting structure, and forming a p-side electrode thereon.

Figure 8A:
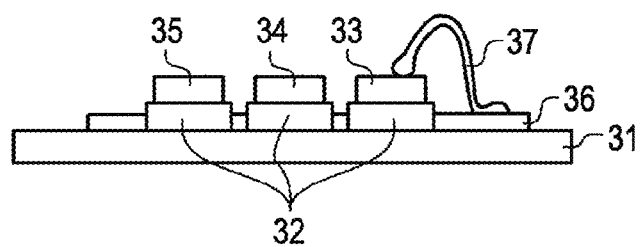
FIGS. 8A to 8C are sectional views to explain a method for manufacturing a light emitting diode backlight according to a third embodiment of the present invention.

Then, the red light emitting diode chip, the green light emitting diode chip, and the blue light emitting diode chip are mounted respectively to sub-mounts each made of AlN, for example. Thereafter, those chips are mounted in a predetermined layout on a substrate, e.g., an Al substrate, with the sub-mounts directed downwards. FIG. 8A illustrates a state after mounting those chips in such a manner. In FIG. 8A, reference numeral 31 denotes the substrate, 32 denotes the sub-mount, 33 denotes the red light emitting diode chip, 34 denotes the green light emitting diode chip, and 35 denotes the blue light emitting diode chip. Each of the red light emitting diode chip 33, the green light emitting diode chip 34, and the blue light emitting diode chip 35 has a chip size of, e.g., 350-μm square. The red light emitting diode chip 33 is mounted such that its n-side electrode is positioned on the sub-mount 32. The green light emitting diode chip 34 and the blue light emitting diode chip 35 are mounted such that their p-side electrode and n-side electrode are each positioned on the sub-mount 32 with the bump interposed therebetween. A lead electrode (not shown) for the n-side electrode is formed in a predetermined pattern on the sub-mount 32 on which the red light emitting diode chip 33 is mounted. Further, the n-side electrode of the red light emitting diode chip 33 is mounted to a predetermined portion of the lead electrode. A wire 37 is bonded to a p-side electrode of the red light emitting diode chip 33 and a predetermined pad electrode 36, which is provided on the substrate 31, for connection between them. In addition, a wire (not shown) is bonded to one end of the above-mentioned lead electrode and another pad electrode, which is provided on the substrate 31, for connection between them. A lead electrode (not shown) for the p-side electrode and a lead electrode (not shown) for the n-side electrode are each formed in a predetermined pattern on the sub-mount 32 on which the green light emitting diode chip 34 is mounted. Further, the p-side electrode and the n-side electrode of the green light emitting diode chip 34 are mounted to respective predetermined portions of the lead electrode for the p-side electrode and the lead electrode for the n-side electrode with interposition of the respective bumps formed on those electrodes therebetween. A wire (not shown) is bonded to one end of the lead electrode for the p-side electrode of the green light emitting diode chip 34 and a pad electrode, which is provided on the substrate 31, for connection between them. In addition, a wire (not shown) is bonded to one end of the lead electrode for the n-side electrode of the green light emitting diode chip 34 and another pad electrode, which is provided on the substrate 31, for connection between them. The blue light emitting diode chip 35 is also mounted in a similar way.

As a modification, the red light emitting diode chip 33, the green light emitting diode chip 34, and the blue light emitting diode chip 35 may be directly mounted to a suitable printed wiring board having a heat radiation property with omission of the sub-mounts 32. Alternatively, the red light emitting diode chip 33, the green light emitting diode chip 34, and the blue light emitting diode chip 35 may be directly mounted to a plate or an inner or outer wall of a housing (e.g., an inner wall of a chassis), which has the same function as that of a printed wiring board. Such direct mounting of the chips can reduce the cost of the light emitting diode backlight or an entire panel.

Figure 8B:
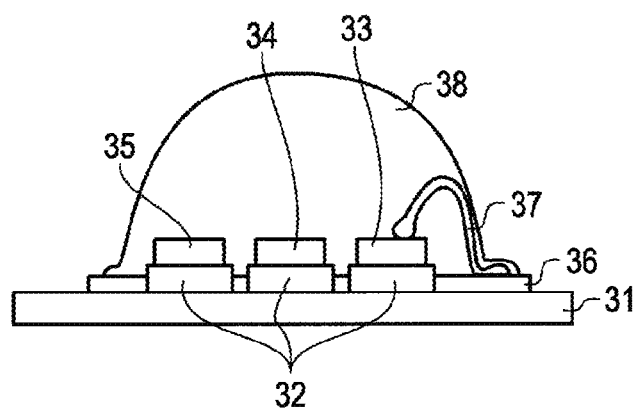
Figure 8C:
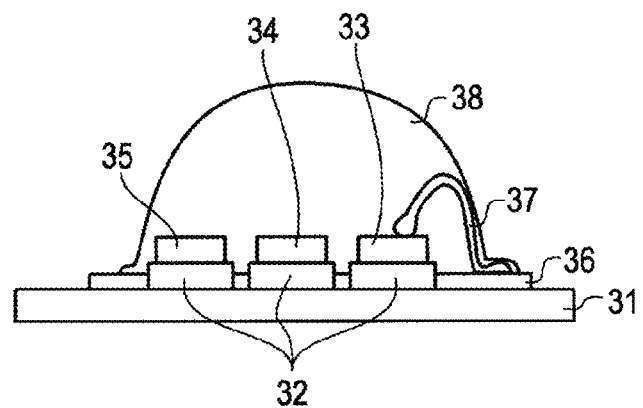
Figure 9:
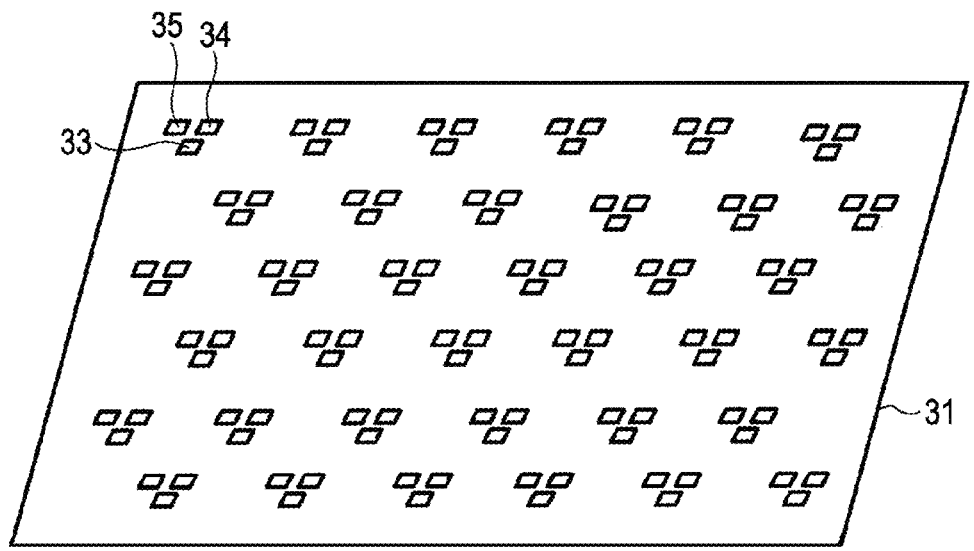
FIG. 9 is a perspective view to explain the method for manufacturing the light emitting diode backlight according to the third embodiment of the present invention.
Figure 10:
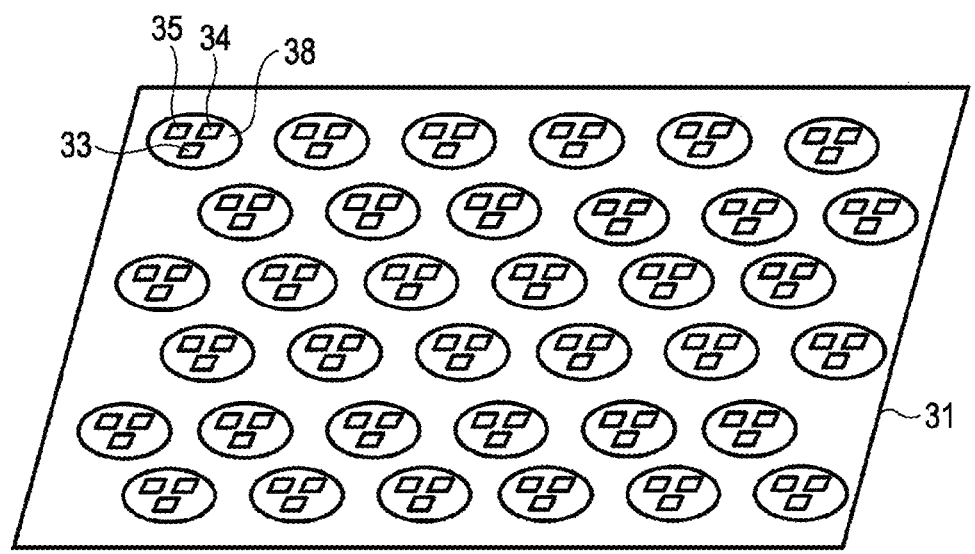
FIG. 10 is a perspective view to explain the method for manufacturing the light emitting diode backlight according to the third embodiment of the present invention.

On condition that the red light emitting diode chip 33, the green light emitting diode chip 34, and the blue light emitting diode chip 35 constitute one cell (unit), a necessary number of cells are arranged in a predetermined pattern on the substrate 31. FIG. 9 illustrates one example of the cell arrangement. Next, as illustrated in FIG. 8B, potting is performed to cover each cell with a transparent resin 38. The transparent resin 38 is then cured. With the curing, the transparent resin 38 is solidified and slightly contracted (FIG. 8C). Thus, as illustrated in FIG. 10, a light emitting diode backlight is obtained in which plural cells, each including the red light emitting diode chip 33, the green light emitting diode chip 34, and the blue light emitting diode chip 35, are arrayed on the substrate 31. With such an arrangement, because the transparent resin 38 is in contact with the rear surfaces of the sapphire substrates 21 of the green light emitting diode chip 34 and the blue light emitting diode chip 35, a difference in refractivity is reduced in comparison with the case where the rear surfaces of the sapphire substrates 21 are in direct contact with air. As a result, a proportion at which light going to pass through the sapphire substrate 21 toward the outside is reflected at the rear surface of the sapphire substrate 21 is reduced, whereby efficiency in taking out the emitted light is increased and hence light emission efficiency is increased.

The light emitting diode backlight according to this embodiment is suitably used as, e.g., a backlight for a liquid crystal panel.

<4. Fourth Embodiment>
[Light Emitting Diode Backlight and Method for Manufacturing the Same]

Figure 11:
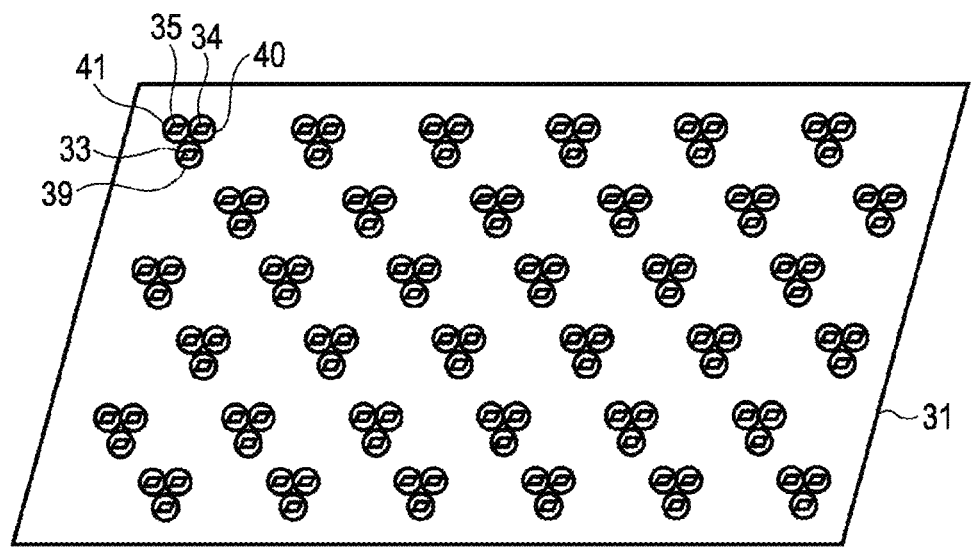
FIG. 11 is a perspective view to explain a method for manufacturing a light emitting diode backlight according to a fourth embodiment of the present invention.

In a fourth embodiment, as in the third embodiment, necessary numbers of the red light emitting diode chip 33, the green light emitting diode chip 34, and the blue light emitting diode chip 35 are arranged in a predetermined pattern on the substrate 31. Thereafter, as illustrated in FIG. 11, potting is performed to cover the red light emitting diode chip 33 with a transparent resin 39 suitable for the red light emitting diode chip 33. Also, potting is performed to cover the green light emitting diode chip 34 with a transparent resin 40 suitable for the green light emitting diode chip 34. Further, potting is performed to cover the blue light emitting diode chip 35 with a transparent resin 41 suitable for the blue light emitting diode chip 35. The transparent resins 39 to 41 are then cured. With the curing, the transparent resins 39 to 41 are solidified and slightly contracted. Thus, a light emitting diode backlight is obtained in which plural cells, each including the red light emitting diode chip 33, the green light emitting diode chip 34, and the blue light emitting diode chip 35, are arrayed on the substrate 31. With such an arrangement, because the transparent resins 40 and 41 are in contact with the rear surfaces of the sapphire substrates 21 of the green light emitting diode chip 34 and the blue light emitting diode chip 35, a difference in refractivity is reduced in comparison with the case where the rear surfaces of the sapphire substrates 21 are in direct contact with air. As a result, a proportion at which light going to pass through the sapphire substrate 21 toward the outside is reflected at the rear surface of the sapphire substrate 21 is reduced, whereby efficiency in taking out the emitted light is increased and hence light emission efficiency is increased.

The light emitting diode backlight according to this embodiment is suitably used as, e.g., a backlight for a liquid crystal panel.

<5. Fifth Embodiment>
[Method for Manufacturing Semiconductor Device and Semiconductor Device]

Figure 12:
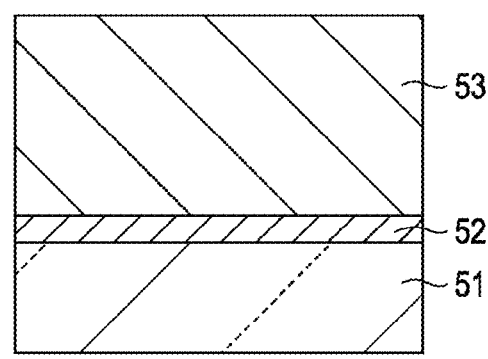
FIG. 12 is a sectional view to explain a method for manufacturing a semiconductor device according to a fifth embodiment of the present invention.

In a fifth embodiment, as illustrated in FIG. 12, a sapphire substrate 51 having a principal surface, which is oriented off at an angle of not less than −0.1° and not more than 0.5° from an R-plane with respect to the direction of a C-axis, is prepared and the surface of the sapphire substrate 51 is cleaned by thermal cleaning, for example, with a usual method.

Next, a low-temperature GaN buffer layer 52 is grown on the cleaned surface of the sapphire substrate 51 by using the MOCVD process. A thickness t (nm) of the low-temperature GaN buffer layer 52 is selected such that, with respect to an off-angle θ of the sapphire substrate 51, (t, θ) falls within a hatched region in a tθ-plane illustrated in FIG. 41.

Next, a nitride-based III-V compound semiconductor layer 53 forming a device structure is grown on the low-temperature GaN buffer layer 52 at a high growth temperature. For example, the MOCVD process is used to grow the nitride-based III-V compound semiconductor layer 53.

Growth conditions of the nitride-based III-V compound semiconductor layer 53 are, for example, as follows. The growth rate is 0.5 to 8 μm/hour, the flow rate of a III element material (such as TMG, TMA, or TMI) is 10 to 200 sccm, the flow rate of a nitrogen material (e.g., $NH_3$) is 5 to 30 slm, the growth temperature is 950 to 1250° C., a V/III ratio of the growth materials is 1000 to 15000, and the growth pressure is 0.01 to 1 atm.

Individual layers constituting the nitride-based III-V compound semiconductor layer 53 is designed as appropriate depending on a semiconductor device to be manufactured. For example, when the semiconductor device is a light emitting diode, the nitride-based III-V compound semiconductor layer 53 has a structure that an active layer is sandwiched between an n-type cladding layer and a p-type cladding layer. When the semiconductor device is a semiconductor laser, the nitride-based III-V compound semiconductor layer 53 has a structure that an active layer is sandwiched between an n-type cladding layer and a p-type cladding layer from above and below, respectively, or a structure that an active layer is sandwiched between optical waveguide layers from above and below, and the optical waveguide layers are further sandwiched between outer cladding layers. When the semiconductor device is an electron transit device, e.g., a field effect transistor, the nitride-based III-V compound semiconductor layer 53 has an electron transit layer (channel layer), etc.

After growing the nitride-based III-V compound semiconductor layer 53, the nitride-based III-V compound semiconductor layer 53 is processed by etching, etc. depending on the case applied, and necessary electrodes (not shown) are then formed.

An objective semiconductor device is manufactured as described above.

EXAMPLE 2

Sapphire substrates 51 having off-angles changed in seven levels, i.e., −0.7°, −0.5°, −0.2°, 0°, +0.2°, +0.5° and +0.7°, relative to the R-plane were prepared. Then, samples were fabricated by growing a low-temperature GaN buffer layer on each of the prepared sapphire substrates 51 at the growth temperature of 550° C., and further growing a GaN layer in a thickness of 3.5 μm thereon with the MOCVD process while the growth temperature was increased to 1000° C.

FIGS. 13A to 13G represent optical microscope images (bright field images) (×5) of surfaces of the samples prepared by growing a low-temperature GaN buffer layer in a thickness of 19 nm on each of the sapphire substrates 51, which have the off-angles of −0.7°, −0.5°, −0.2°, 0°, +0.2°, +0.5° and +0.7°, and then growing the GaN layer thereon. Further, FIGS. 14A to 14G represent optical microscope images (bright field images) (×100) of surfaces of the samples prepared by growing the low-temperature GaN buffer layer in the thickness of 19 nm on each of the sapphire substrates 51, which have the off-angles of −0.7°, −0.5°, −0.2°, 0°, +0.2°, +0.5° and +0.7°, and then growing the GaN layer thereon. As seen from FIGS. 13A to 13G and FIGS. 14A to 14G, the surfaces of the GaN layers grown on the sapphire substrates 51 having the off-angles of −0.2°, 0° C., +0.2° and +0.5° are flat and exhibit good crystallinity. On the other hand, the surfaces of the GaN layers grown on the sapphire substrates 51 having the off-angles of −0.7°, −0.5° and +0.7° are inferior in both flatness and crystallinity.

FIGS. 15A to 15G represent optical-microscope differential interference images (×5) of surfaces of the samples prepared by growing the low-temperature GaN buffer layer in the thickness of 19 nm on each of the sapphire substrates 51, which have the off-angles of −0.7°, −0.5°, −0.2°, 0°, +0.2°, +0.5°, and +0.7°, and then growing the GaN layer thereon. As seen from FIGS. 15A to 15G, the surfaces of the GaN layers grown on the sapphire substrates 51 having the off-angles of −0.2°, 0° C., +0.2° and +0.5° are flat and exhibit good crystallinity. On the other hand, the surfaces of the GaN layers grown on the sapphire substrates 51 having the off-angles of −0.7°, −0.5° and +0.7° are inferior in both flatness and crystallinity.

FIGS. 16A to 16G represent fluorescence images of surfaces of the samples prepared by growing the low-temperature GaN buffer layer in the thickness of 19 nm on each of the sapphire substrates 51, which have the off-angles of −0.7°, −0.5°, −0.2°, 0°, +0.2°, +0.5° and +0.7°, and then growing the GaN layer thereon. As seen from FIGS. 16A to 16G, the surfaces of the GaN layers grown on the sapphire substrates 51 having the off-angles of −0.2°, 0° C., +0.2° and +0.5° are flat and exhibit good crystallinity. On the other hand, the surfaces of the GaN layers grown on the sapphire substrates 51 having the off-angles of −0.7°, −0.5° and +0.7° are inferior in both flatness and crystallinity.

FIGS. 17A to 17D represent optical microscope images (bright field images) (×5) of surfaces of samples prepared by growing each of low-temperature GaN buffer layers in thicknesses of 18 nm, 25 nm, 38 nm, and 55 nm on a sapphire substrate 51, which has an off-angle of +0.2°, and then growing the GaN layer thereon. Further, FIGS. 18A to 18D represent optical microscope images (bright field images) (×100) of the surfaces of the samples prepared by growing each of the low-temperature GaN buffer layers in thicknesses of 18 nm, 25 nm, 38 nm, and 55 nm on the sapphire substrate 51, which has the off-angle of +0.2°, and then growing the GaN layer thereon. As seen from FIGS. 17A to 17D and FIGS. 18A to 18D, the smaller the thickness of the low-temperature GaN buffer layer, the higher are surface flatness and crystallinity of the GaN layer. More specifically, when the thickness of the low-temperature GaN buffer layer is 25 nm, the surface flatness and the crystallinity are substantially improved in comparison with the case where the thickness of the low-temperature GaN buffer layer is 38 nm. Further, when the thickness of the low-temperature GaN buffer layer is 18 nm, the surface flatness and the crystallinity are both very superior.

FIGS. 19A to 19D represent optical microscope images (bright field images) (×5) of surfaces of samples prepared by growing each of low-temperature GaN buffer layers in thicknesses of 18 nm, 25 nm, 38 nm, and 55 nm on a sapphire substrate 51, which has an off-angle of +0.5°, and then growing the GaN layer thereon. Further, FIGS. 20A to 20D represent optical microscope images (bright field images) (×100) of the surfaces of the samples prepared by growing each of the low-temperature GaN buffer layers in thicknesses of 18 nm, 25 nm, 38 nm, and 55 nm on the sapphire substrate 51, which has the off-angle of +0.5°, and then growing the GaN layer thereon. As seen from FIGS. 19A to 19D and FIGS. 20A to 20D, the smaller the thickness of the low-temperature GaN buffer layer, the higher are surface flatness and crystallinity of the GaN layer. More specifically, when the thickness of the low-temperature GaN buffer layer is 38 nm, the surface flatness and the crystallinity are substantially improved in comparison with the case where the thickness of the low-temperature GaN buffer layer is 55 nm. Further, when the thickness of the low-temperature GaN buffer layer is 25 nm and 18 nm, the surface flatness and the crystallinity are both very superior.

Figure 21:
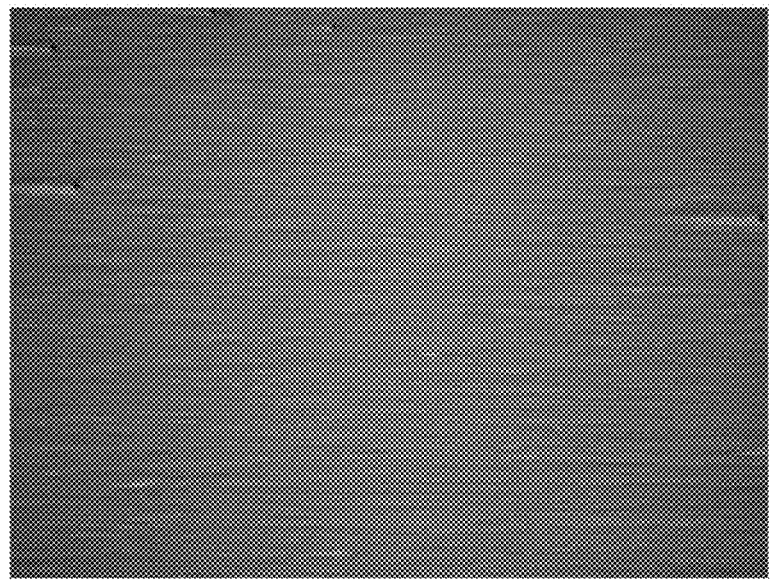
FIG. 21 is a photograph, substituted for a view, representing an optical-microscope differential interference image of the surface of the GaN layer grown on the sapphire substrate, which has the off-angle of 0.2°, according to the fifth embodiment of the present invention with interposition of a low-temperature GaN buffer layer having a thickness of 18 nm therebetween.
Figure 22:
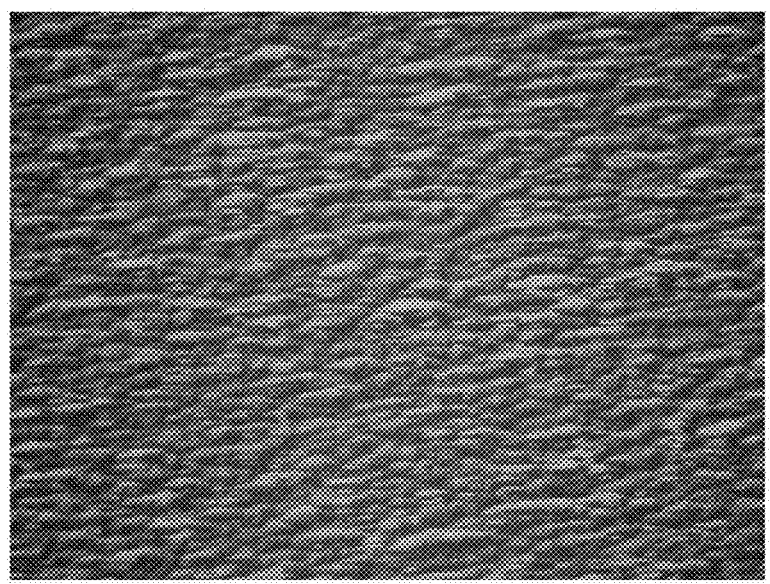
FIG. 22 is a photograph, substituted for a view, representing an optical-microscope differential interference image of the surface of a GaN layer grown on the sapphire substrate, which has the off-angle of 0.5°, according to the fifth embodiment of the present invention with interposition of a low-temperature GaN buffer layer having a thickness of 18 nm therebetween.

FIGS. 21 and 22 represent optical-microscope differential interference images (×5) of the surfaces of the samples prepared by growing the low-temperature GaN buffer layers 52 in the thickness of 18 nm on each of the sapphire substrates 51, which have the off-angles of +0.2° and +0.5°, respectively, and then growing the GaN layer thereon. As seen from FIGS. 21 and 22, the surface of the GaN layer is flatter when the off-angle is +0.2° than when the off-angle is +0.5°.

The result of analyzing a tilt of a growth axis of the GaN layer, which has been grown on the sapphire substrate 51 with the low-temperature GaN buffer layer 52 interposed therebetween, with respect to an axis perpendicular to the principal surface of the sapphire substrate 51 (hereinafter referred to as a "substrate axis") will be described below.

Figure 23:
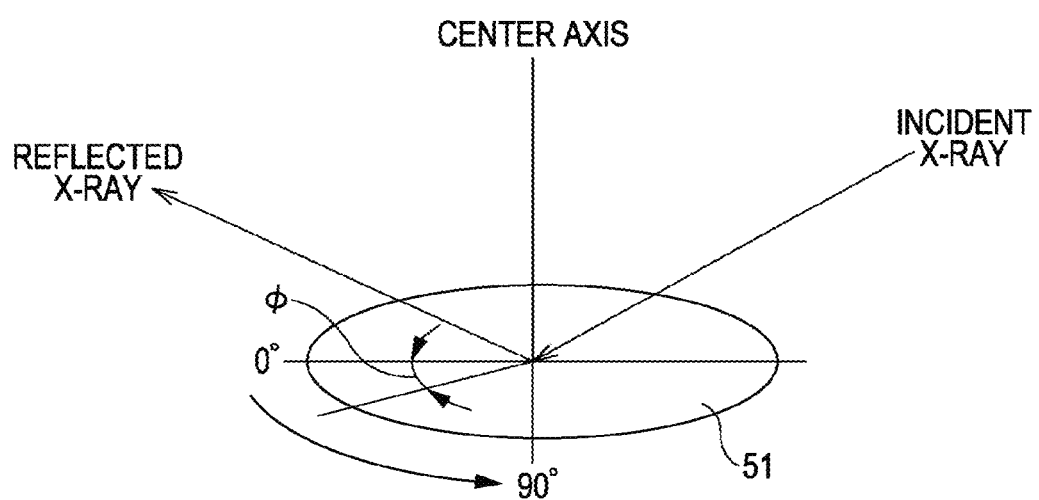
FIG. 23 is an illustration to explain a method for measuring a tilt of a growth axis of the GaN layer with respect to a substrate axis by utilizing X-ray diffraction in the fifth embodiment of the present invention.
Figure 24:
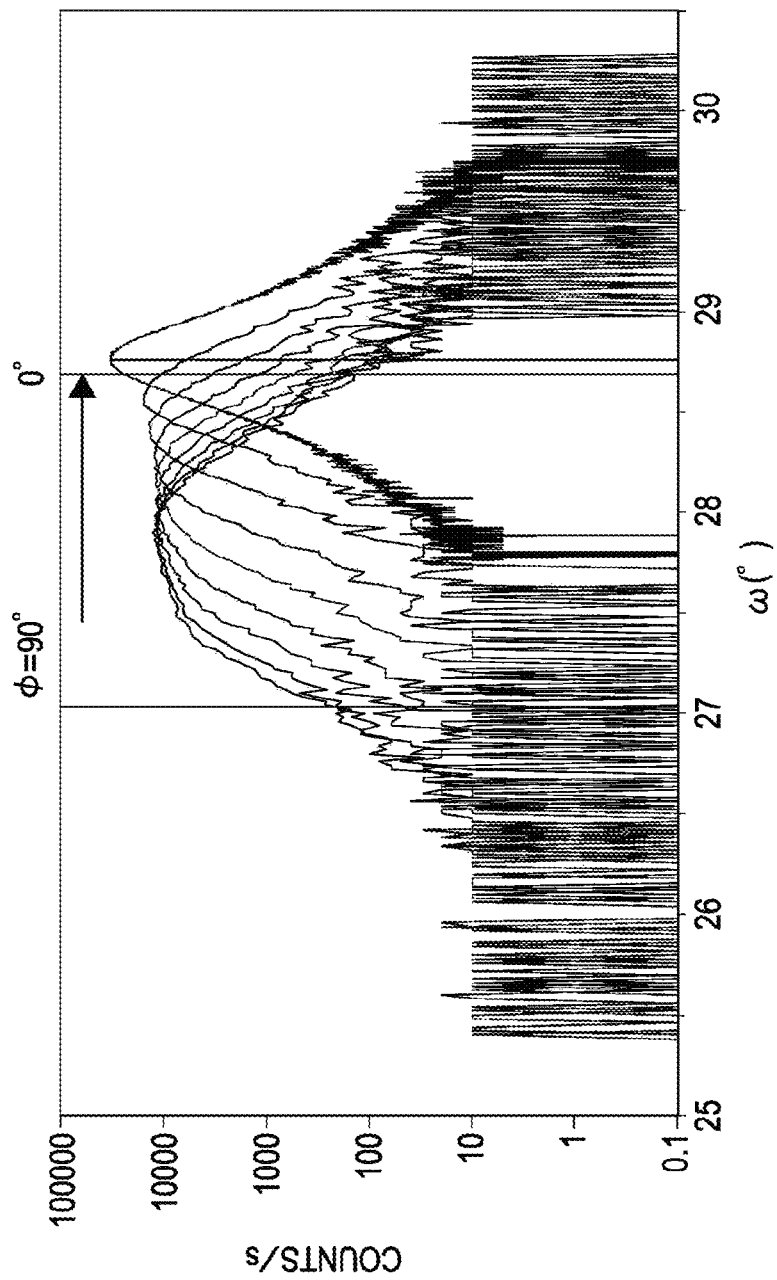
FIG. 24 is a graph representing rocking curves of a GaN layer grown on the sapphire substrate, which has the off-angle of 0.2°, according to the fifth embodiment of the present invention with interposition of a low-temperature GaN buffer layer having a thickness of 55 nm therebetween.
Figure 25:
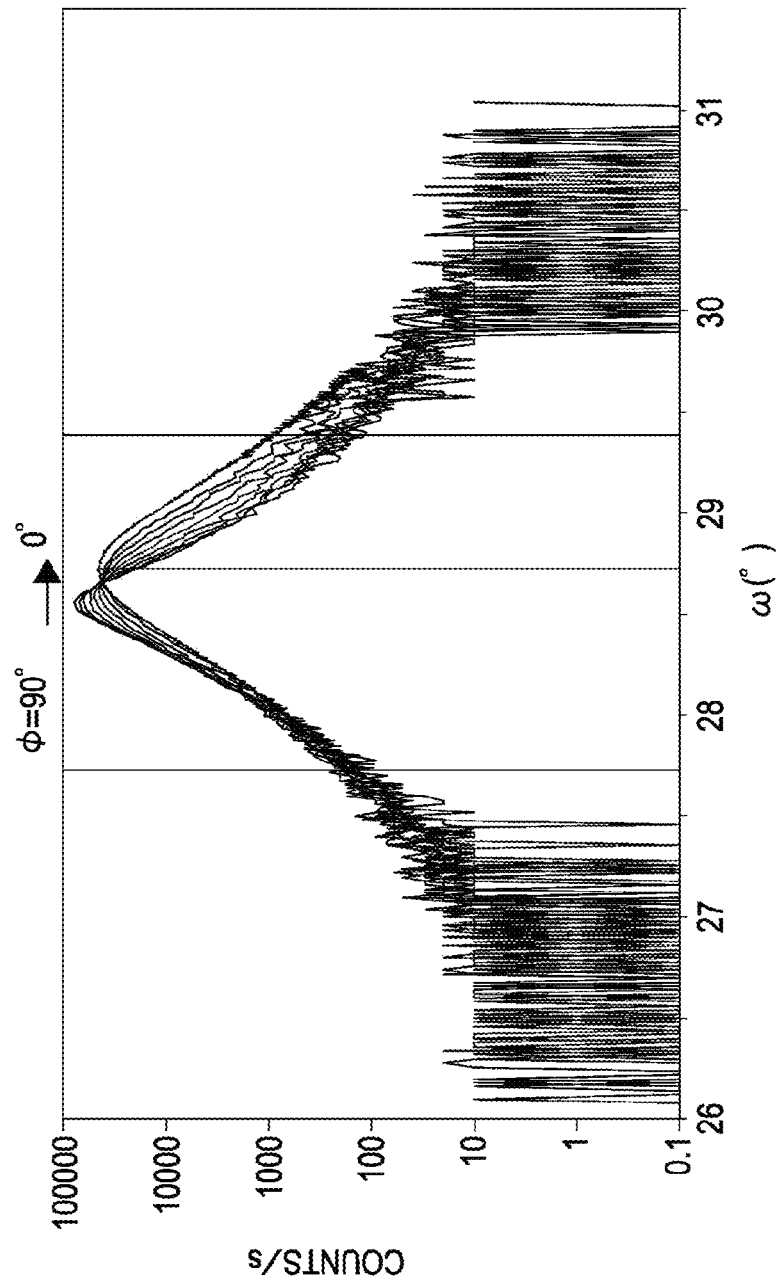
FIG. 25 is a graph representing rocking curves of a GaN layer grown on the sapphire substrate, which has the off-angle of 0.2°, according to the fifth embodiment of the present invention with interposition of a low-temperature GaN buffer layer having a thickness of 18 nm therebetween.

Rocking curves (ω scan) were measured, as illustrated in FIG. 23, by irradiating a monochromatic X-ray to enter a sample (at an incident angle of ω), which was prepared by growing each of low-temperature GaN buffer layers (not shown) in thicknesses of 55 nm and 18 nm on the sapphire substrate 51, which had the off-angle of +0.2°, and then growing the GaN layer (not shown), and by observing (11-20) reflection of the X-ray from the GaN layer. The Bragg angle of the GaN (11-20) reflection was 28.72°. The rocking curves were measured, as illustrated in FIG. 23, while the sapphire substrate 51 was rotated about its center axis so as to change an angle φ about the center axis from 90° to 0° in steps of 10°. FIGS. 24 and 25 represent the rocking curves for the samples with the low-temperature GaN buffer layers having the thicknesses of 55 nm and 18 nm, respectively. A tilt angle (inclination angle) of the growth axis of the GaN layer with respect to the substrate axis of the sapphire substrate 51 can be determined from the rocking curves. Thus, as seen from FIGS. 24 and 25, in comparison with the case where the thickness of the low-temperature GaN buffer layer is 55 nm, the tilt angle of a principal surface of the GaN layer with respect to the principal surface of the sapphire substrate 51 is much smaller in the case where the thickness of the low-temperature GaN buffer layer is 18 nm, i.e., smaller than 55 nm. This result implies that not only the surface flatness of the GaN layer, but also the crystallinity thereof can be improved by reducing the thickness of the low-temperature GaN buffer layer 52.

Figure 26:
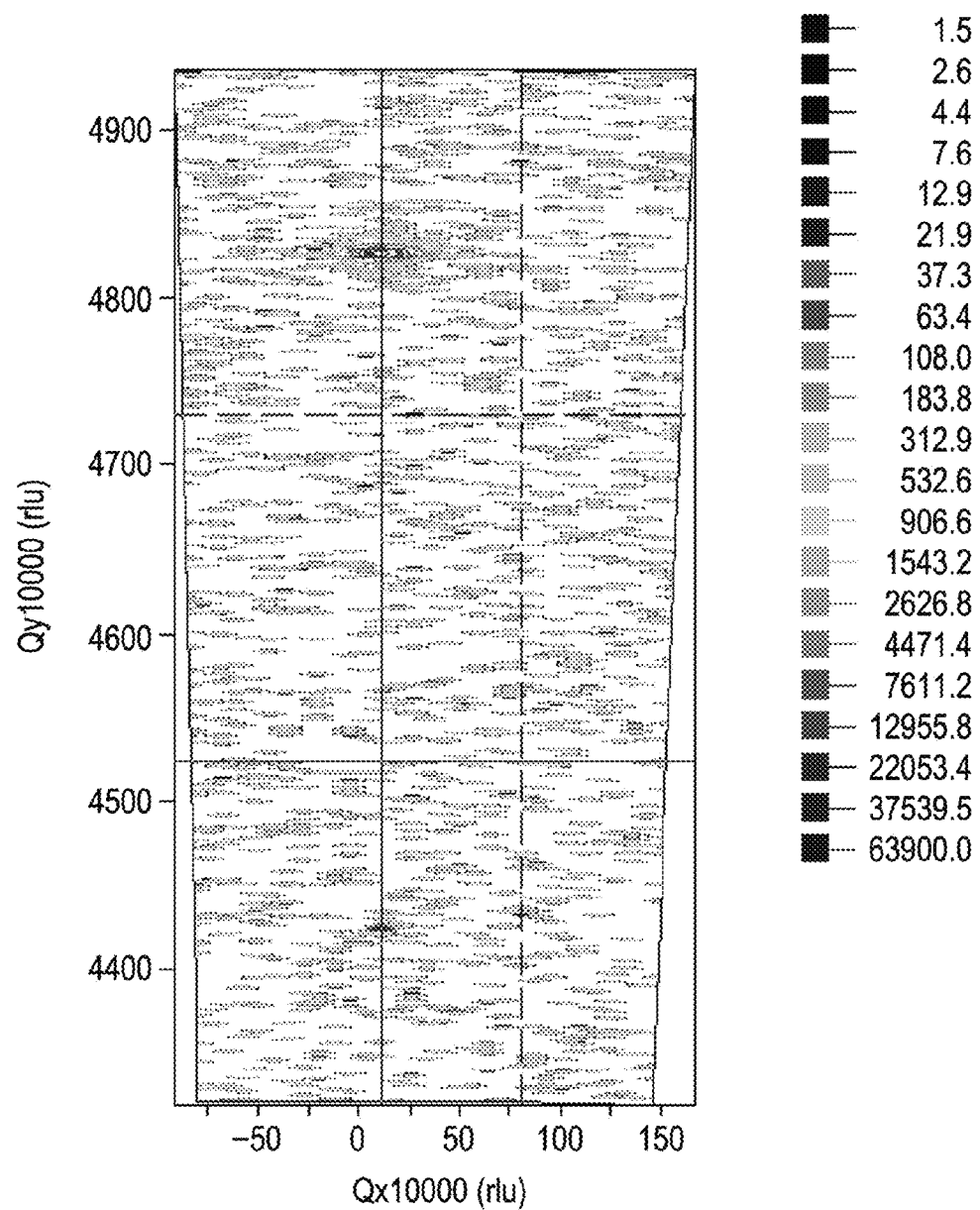
FIG. 26 is a chart representing the result of reciprocal space (lattice) mapping measured at φ=0° in the direction of a growth axis of a GaN layer grown on the sapphire substrate, which has the off-angle of 0.2°, according to the fifth embodiment of the present invention with interposition of a low-temperature GaN buffer layer having a thickness of 55 nm therebetween.
Figure 27:
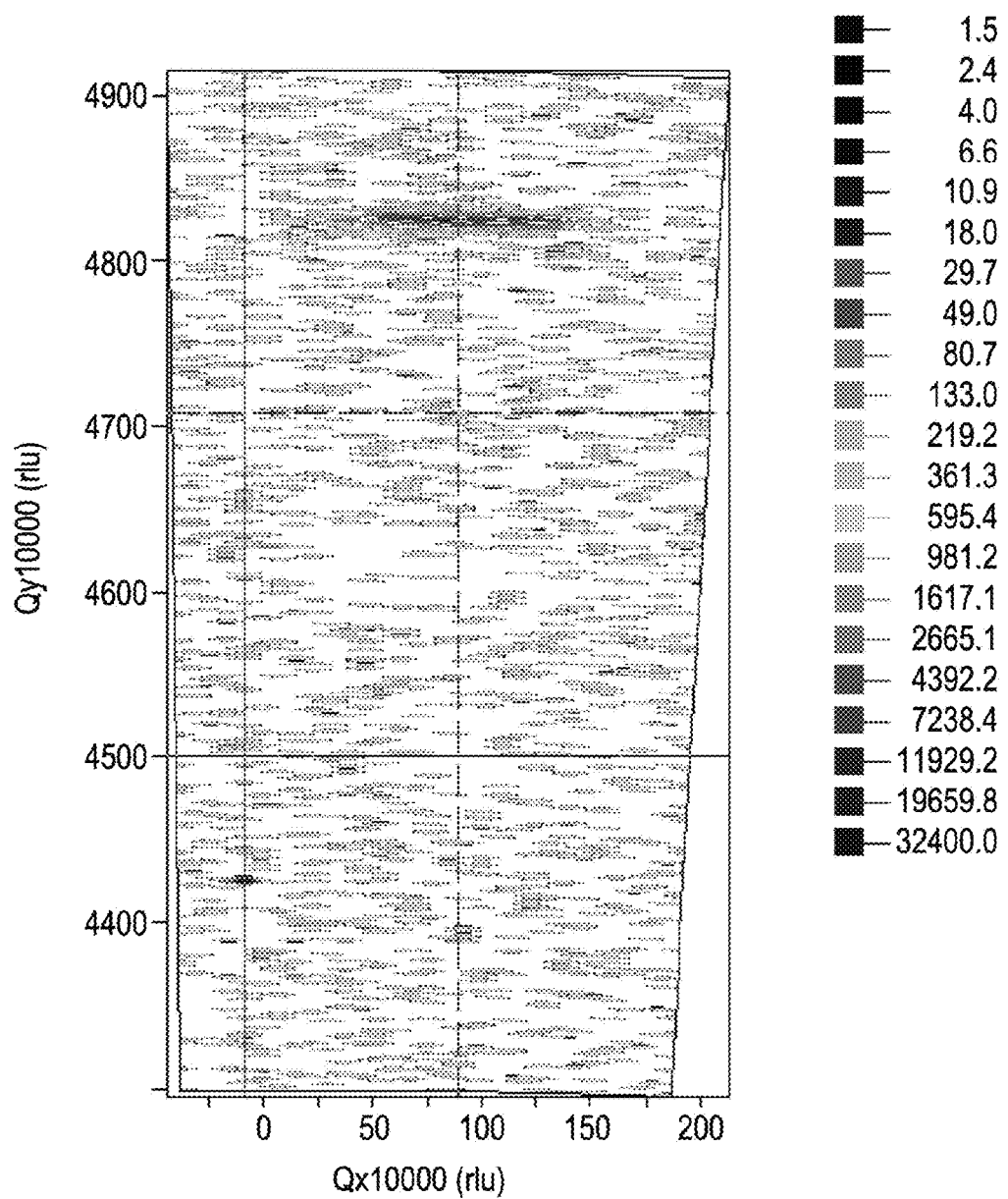
FIG. 27 is a chart representing the result of reciprocal space mapping measured at φ=90° in the direction of the growth axis of the GaN layer grown on the sapphire substrate, which has the off-angle of 0.2°, according to the fifth embodiment of the present invention with interposition of the low-temperature GaN buffer layer having a thickness of 55 nm therebetween.
Figure 28:
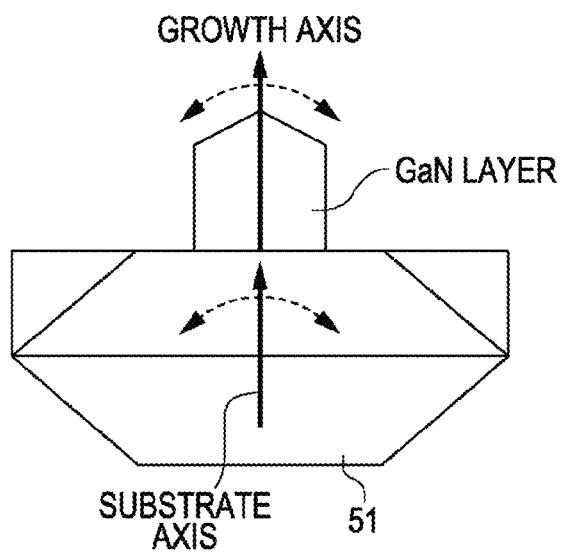
FIG. 28 is an illustration to explain a tilt, with respect to the substrate axis, of the growth axis of the GaN layer grown on the sapphire substrate, which has the off-angle of 0.2°, according to the fifth embodiment of the present invention with interposition of the low-temperature GaN buffer layer having the thicknesses of 55 nm therebetween.
Figure 29:
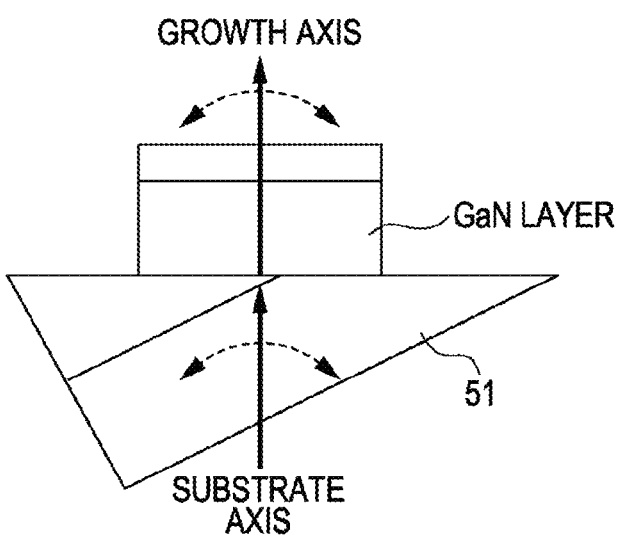
FIG. 29 is an illustration to explain a tilt, with respect to the substrate axis, of the growth axis of the GaN layer grown on the sapphire substrate, which has the off-angle of 0.2°, according to the fifth embodiment of the present invention with interposition of the low-temperature GaN buffer layer having the thicknesses of 55 nm therebetween.

FIGS. 26 and 27 are each a chart representing the result of reciprocal space (lattice) mapping measured in the direction of the growth axis of the GaN layer in the sample, which is prepared by growing the low-temperature GaN buffer layer in the thickness of 55 nm on the sapphire substrate 51, which has the off-angle θ of +0.2°, and then growing the GaN layer thereon. FIG. 26 represents the case of φ=0° and FIG. 27 represents the case of φ=90°. The relationship between the direction of the substrate axis of the sapphire substrate 51 and the direction of the growth axis of the GaN layer can be evaluated based on the result of the reciprocal space mapping. FIG. 28 is an illustration looking at, from the direction of φ=0°, the sample which is prepared by growing the low-temperature GaN buffer layer (not shown) on the sapphire substrate 51 and then growing the GaN layer thereon. Thus, the tilt of the growth axis of the GaN layer with respect to the substrate axis of the sapphire substrate 51 in the plane illustrated in FIG. 28 can be evaluated based on the result of the reciprocal space mapping at φ=0°, which is illustrated in FIG. 26. FIG. 29 is an illustration looking at, from the direction of φ=90°, the sample which is prepared by growing the low-temperature GaN buffer layer (not shown) on the sapphire substrate 51 and then growing the GaN layer thereon. Thus, the tilt of the growth axis of the GaN layer with respect to the substrate axis of the sapphire substrate 51 in the plane illustrated in FIG. 29 can be evaluated based on the result of the reciprocal space mapping at φ=90°, which is illustrated in FIG. 27. As seen from FIGS. 26 and 27, in the sample in which the thickness of the low-temperature GaN buffer layer 52 is as large as 55 nm, the direction of the substrate axis of the sapphire substrate 51 and the direction of the growth axis of the GaN layer are aligned with each other when measured at φ=0°, but the direction of the growth axis of the GaN layer is largely tilted with respect to the substrate axis of the sapphire substrate 51 when measured at φ=90°.

Figure 30:
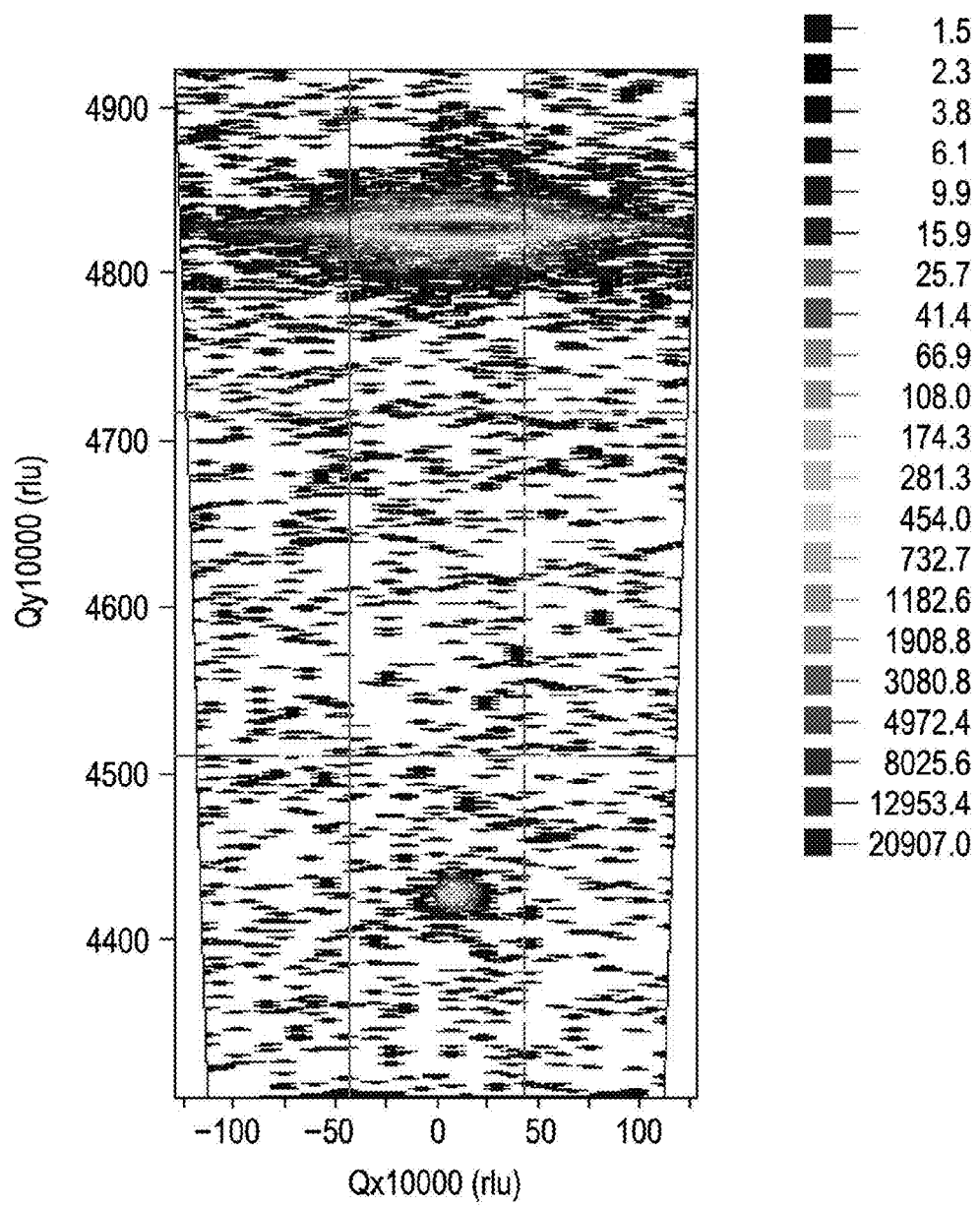
FIG. 30 is a chart representing the result of reciprocal space mapping measured at φ=0° in the direction of a growth axis of a GaN layer grown on the sapphire substrate, which has the off-angle of 0.2°, according to the fifth embodiment of the present invention, without growing a low-temperature buffer layer on the sapphire substrate.
Figure 31:
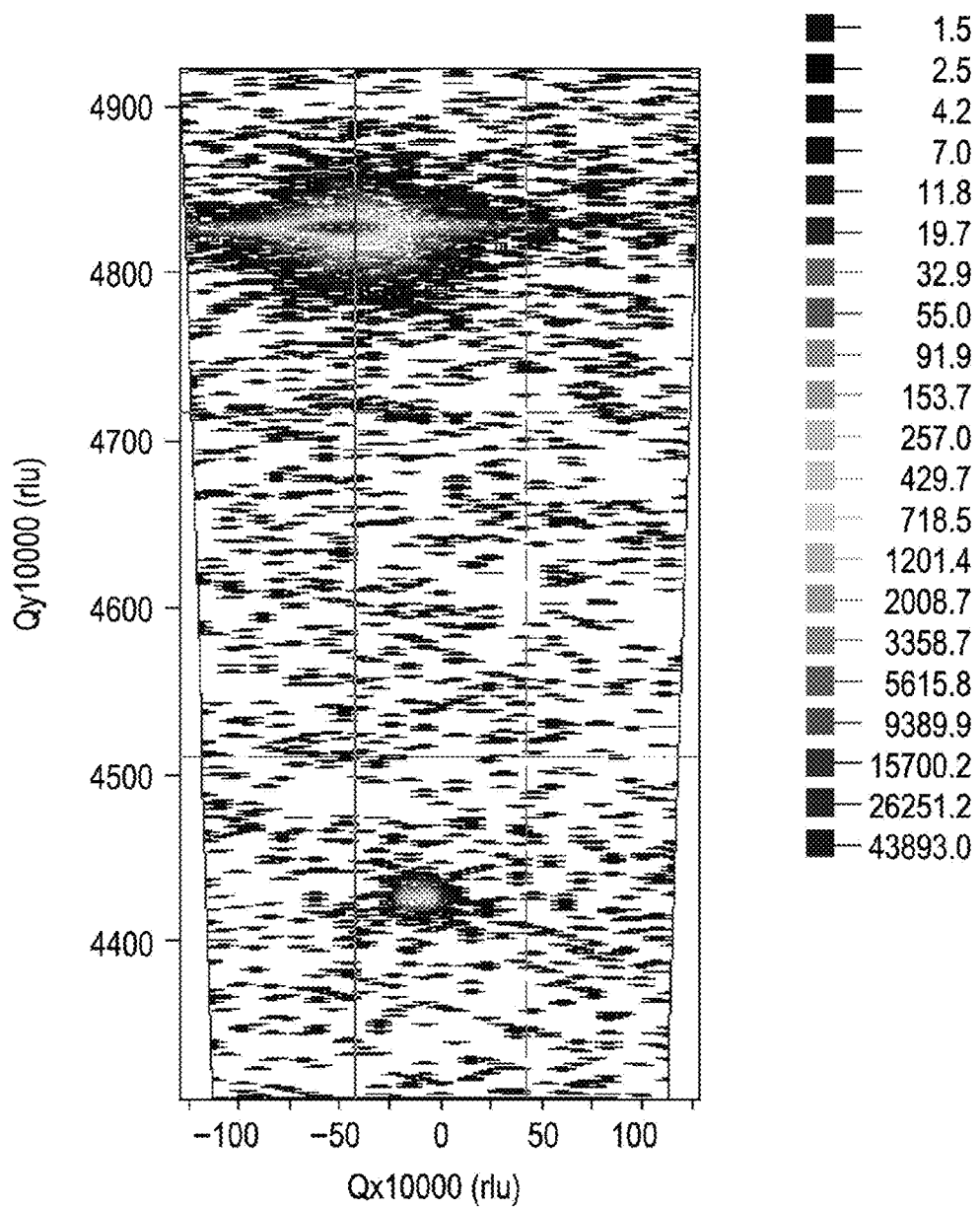
FIG. 31 is a chart representing the result of reciprocal space mapping measured at φ=90° in the direction of the growth axis of the GaN layer grown on the sapphire substrate, which has the off-angle of 0.2°, according to the fifth embodiment of the present invention, without growing a low-temperature buffer layer on the sapphire substrate.
Figure 32A:
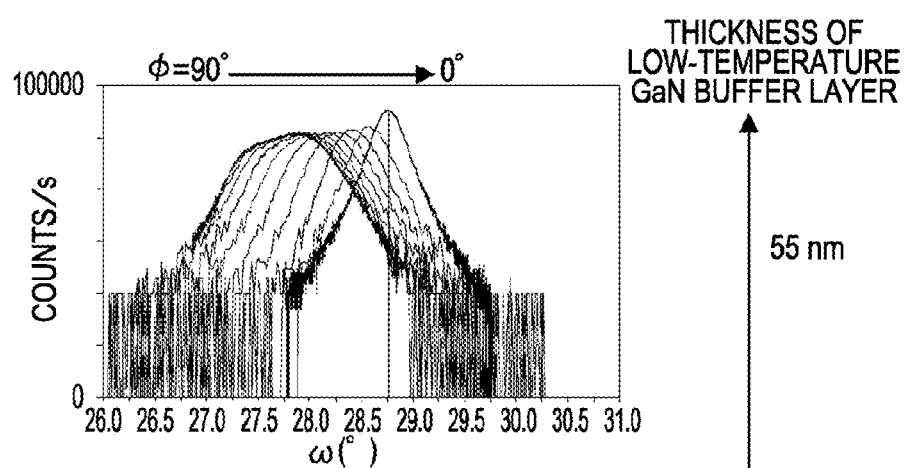
FIGS. 32A to 32D are graphs representing rocking curves of GaN layers grown on the sapphire substrates, each of which has the off-angle of 0.2°, according to the fifth embodiment of the present invention with interposition of each of low-temperature GaN buffer layers having various thicknesses therebetween.
Figure 32B:
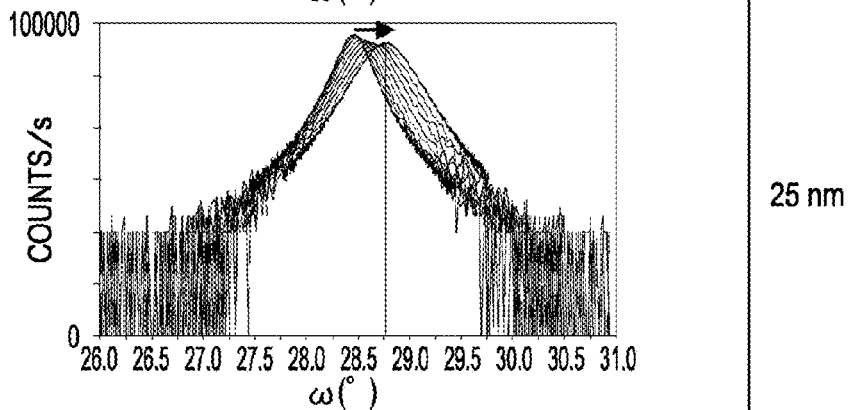
Figure 32C:
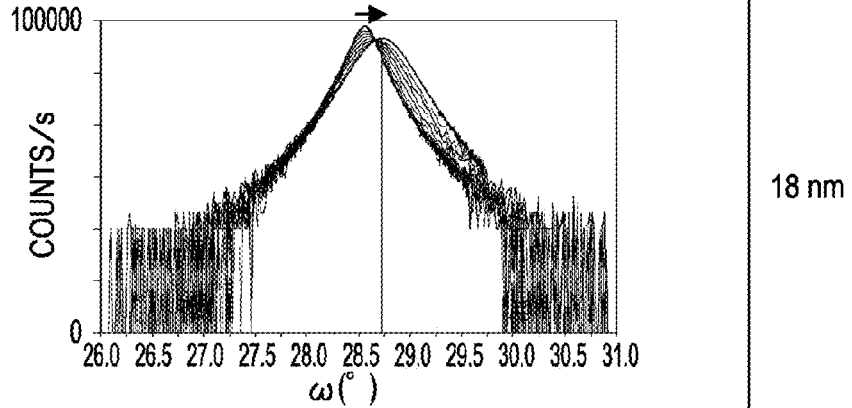
Figure 32D:
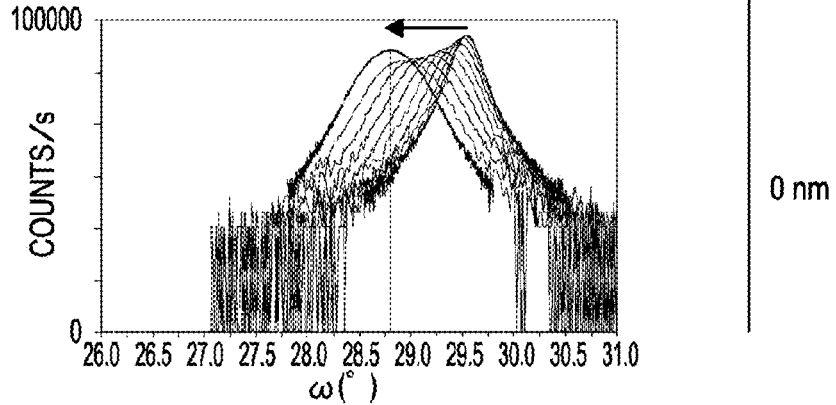

FIGS. 30 and 31 are each a chart representing the result of reciprocal space mapping measured in the direction of a growth axis of a GaN layer in a sample, which is prepared by growing the GaN layer on the sapphire substrate 51, which has the off-angle φ of +0.2°, without growing the low-temperature GaN buffer layer on the sapphire substrate 51. FIG. 30 represents the case of φ=0° and FIG. 31 represents the case of φ=90°. As seen from FIGS. 30 and 31, in the sample in which the GaN layer is grown without growing the low-temperature GaN buffer layer, the direction of the growth axis of the GaN layer is largely tilted with respect to the substrate axis of the sapphire substrate 51, when measured at φ=90°, in the direction opposed to that in the sample in which the GaN layer is grown after growing the low-temperature GaN buffer layer in the thickness of 55 nm on the sapphire substrate 51, which has the off-angle θ of +0.2°.

FIGS. 32A to 32D are graphs representing the results of measuring rocking curves for the (11-20) reflection from the GaN layer in each of samples which are prepared by growing each of low-temperature GaN buffer layers in thicknesses of 0 nm, 18 nm, 25 nm and 55 nm on the sapphire substrate 51, which has the off-angle θ of +0.2°, and then growing the GaN layer. FIGS. 33A to 33D and FIGS. 34A to 34D illustrate the relationship between the direction of the substrate axis of the sapphire substrate 51 and the direction of a growth axis of each GaN layer, which is determined based on the rocking curves illustrated in FIGS. 32A to 32D. As seen from FIGS. 33A to 33D and FIGS. 34A to 34D, when the thickness of the low-temperature GaN buffer layer is as large as 55 nm, a deviation between the direction of the substrate axis of the sapphire substrate 51 and the direction of the growth axis of the GaN layer is substantially large. However, the deviation between the direction of the substrate axis of the sapphire substrate 51 and the direction of the growth axis of the GaN layer is very small when the thickness of the low-temperature GaN buffer layer is about 18 nm.

Figure 35A:
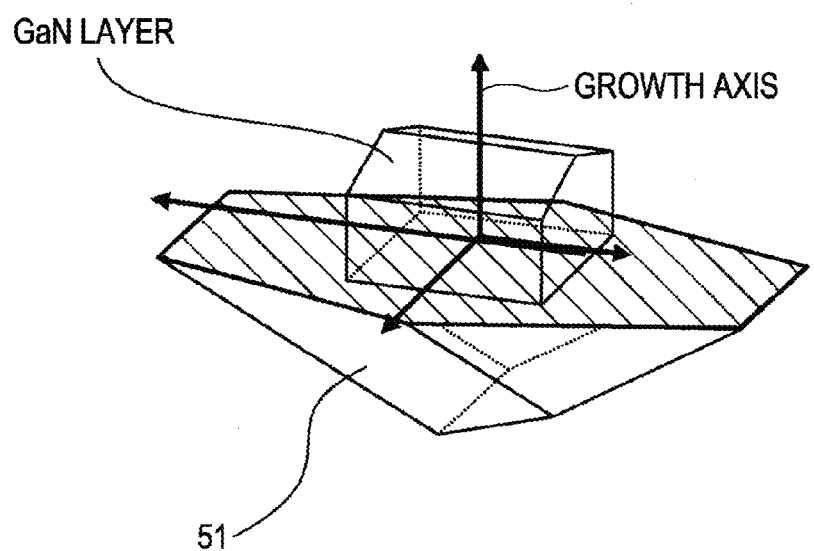
FIGS. 35A and 35B are each an illustration to explain a tilt, with respect to the substrate axis, of the growth axis of the GaN layer grown on the sapphire substrate, which has the off-angle of 0.2°, according to the fifth embodiment of the present invention with interposition of the low-temperature GaN buffer layer therebetween.
Figure 35B:
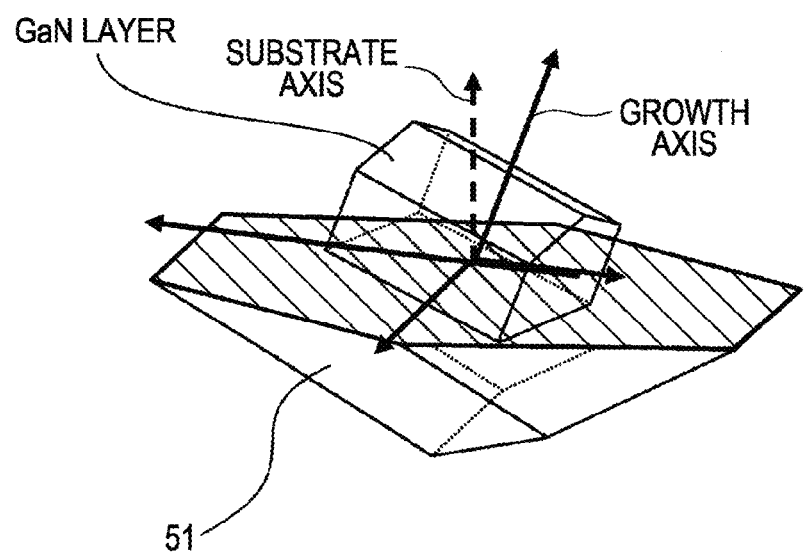
Figures 36A, 36B:
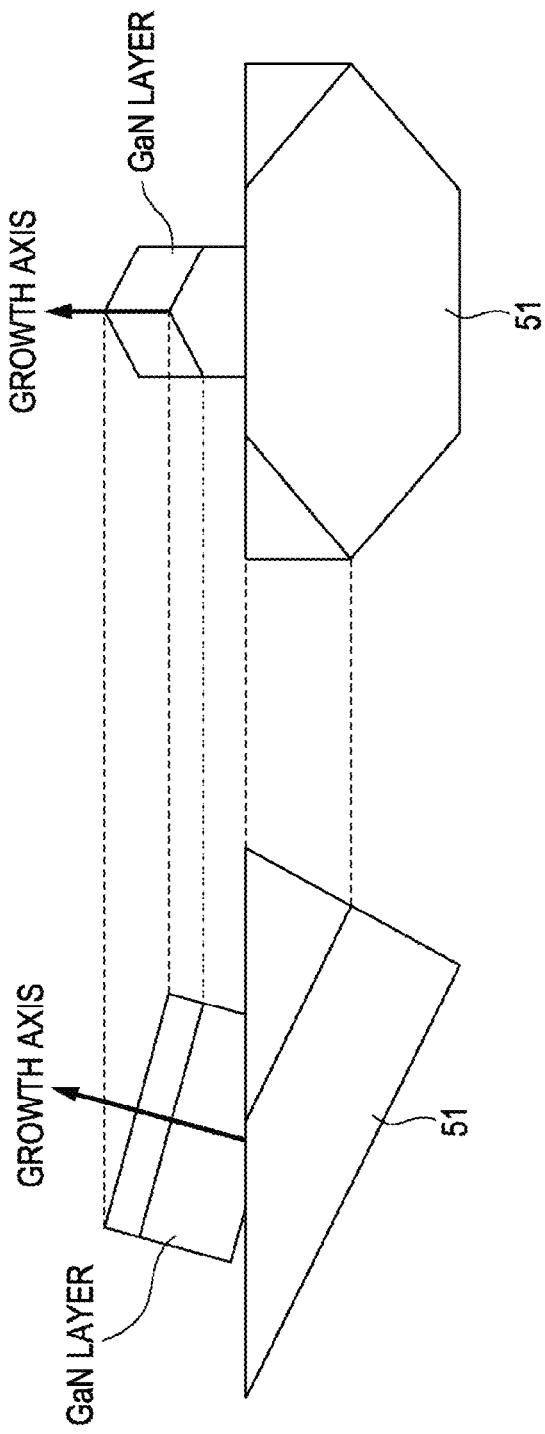
FIG. 36 is an illustration to explain the tilt, with respect to the substrate axis, of the growth axis of the GaN layer grown on the sapphire substrate, which has the off-angle of 0.2°, according to the fifth embodiment of the present invention with interposition of the low-temperature GaN buffer layer therebetween.
Figure 37A:
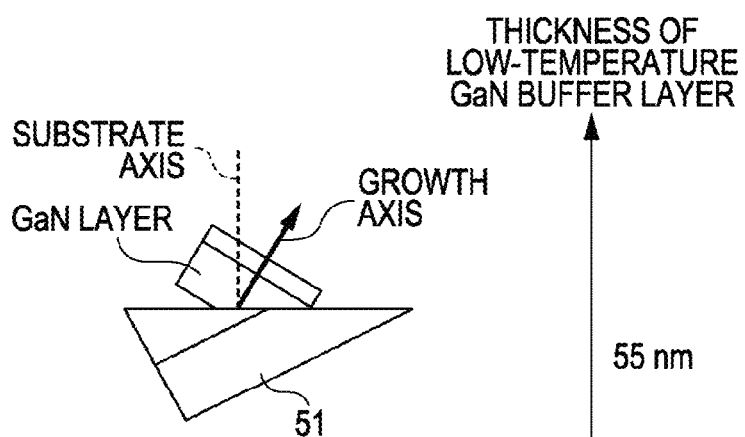
FIGS. 37A to 37D are illustrations to explain the tilt, with respect to the substrate axis, of the growth axis of each of the GaN layers grown on the sapphire substrates, each of which has the off-angle of 0.2°, according to the fifth embodiment of the present invention with interposition of each of the low-temperature GaN buffer layers having various thicknesses therebetween.
Figure 37B:
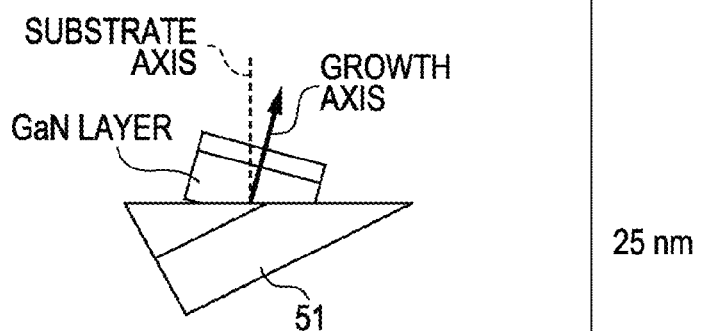
Figure 37C:
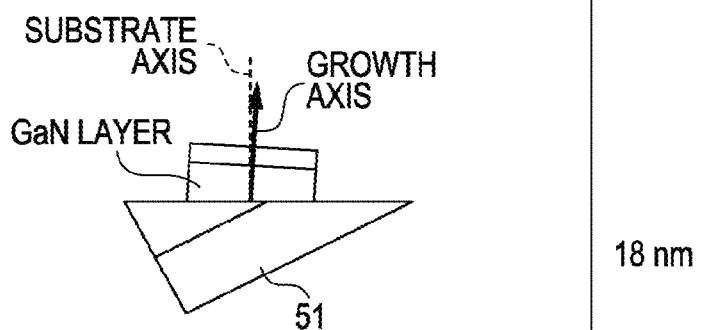
Figure 37D:
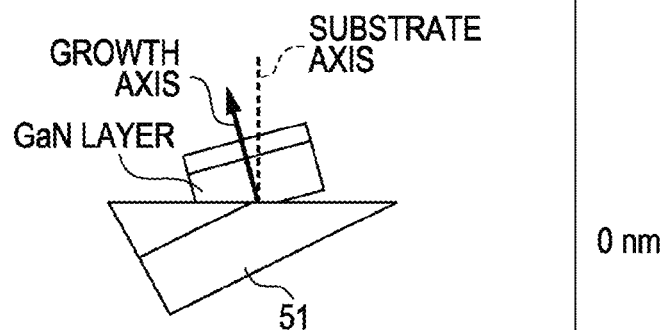

FIG. 35A conceptually illustrates the case where the GaN layer is grown such that the growth axis of the GaN layer aligns with the direction of the substrate axis of the sapphire substrate 51. FIG. 35B illustrates the case where the growth axis of the GaN layer is tilted with respect to the substrate axis of the sapphire substrate 51. FIG. 36A is a projected view obtained by projecting the state illustrated in FIG. 35B to an A-plane of the sapphire substrate 51. Also, FIG. 36B illustrates the state obtained by rotating the sapphire substrate 51, illustrated in FIG. 36A, through 90° about the center axis thereof.

FIGS. 37A to 37D are projected views, similar to that of FIG. 35A, obtained respectively by projecting the states illustrated in FIG. 33A to 33D to the A-plane of the sapphire substrate 51.

Figure 38:
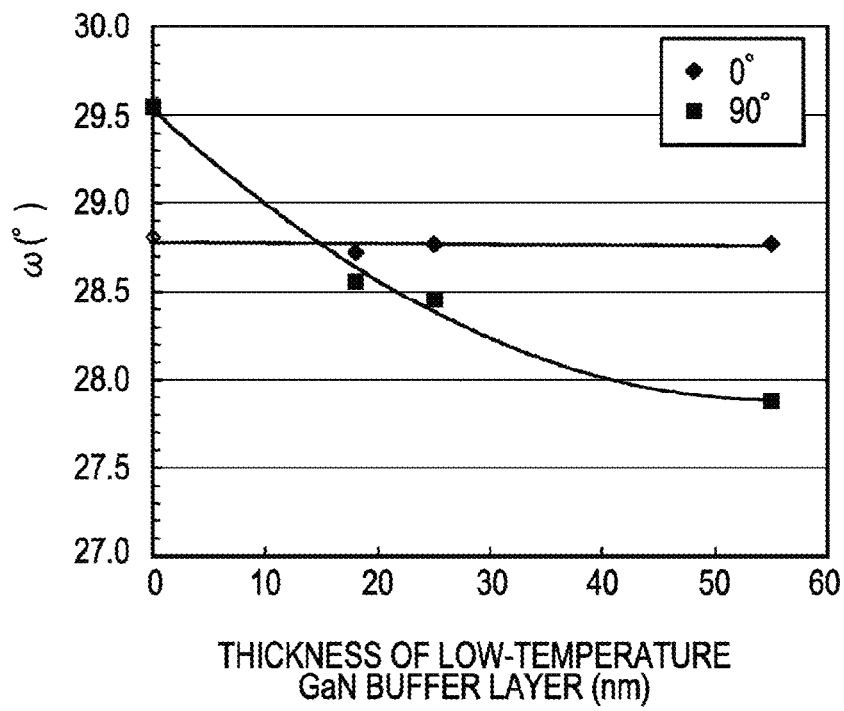
FIG. 38 is a graph illustrating changes in angle of the tilt, with respect to the substrate axis, of the growth axis of each of the GaN layers grown on the sapphire substrates, each of which has the off-angle of 0.2°, according to the fifth embodiment of the present invention with interposition of the low-temperature GaN buffer layer therebetween, depending on the thickness of the low-temperature GaN buffer layer.
Figure 39:
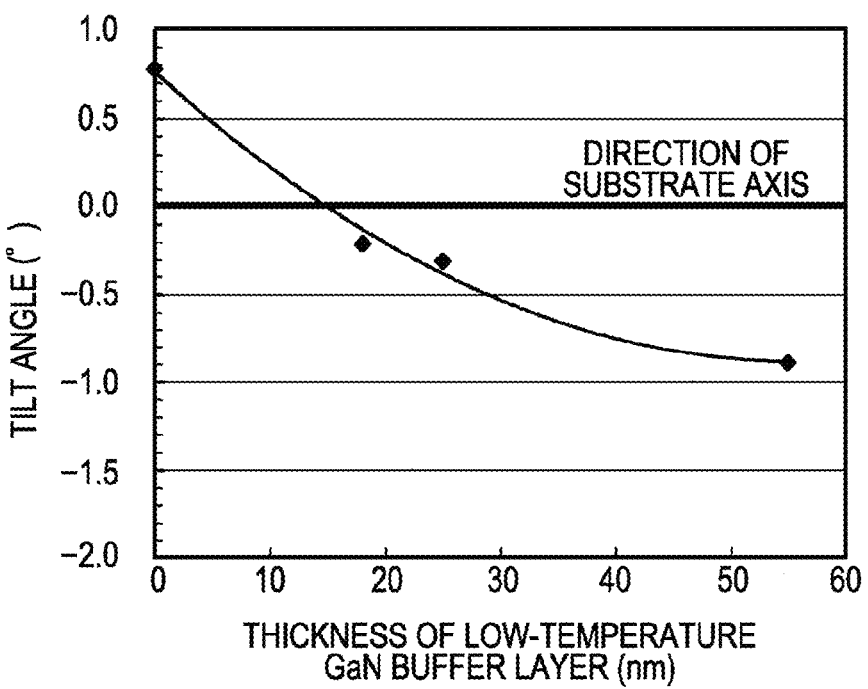
FIG. 39 is a graph illustrating changes in angle of the tilt, with respect to the substrate axis, of the growth axis of each of the GaN layers grown on the sapphire substrates, each of which has the off-angle of 0.2°, according to the fifth embodiment of the present invention with interposition of the low-temperature GaN buffer layer therebetween, depending on the thickness of the low-temperature GaN buffer layer.

FIG. 38 plots changes in ω depending on the thickness of the low-temperature GaN buffer layer 52 at φ=0° and φ=90°. As seen from FIG. 38, in the case of φ=0°, ω is constant regardless of the thickness of the low-temperature GaN buffer layer 52. In the case of φ=90°, however, ω monotonously decreases with an increase of the thickness of the low-temperature GaN buffer layer 52. FIG. 39 plots, based on the graph of FIG. 38, a tilt angle of the growth axis of the GaN layer with respect to the substrate axis of the sapphire substrate 51 depending on the thickness of the low-temperature GaN buffer layer 52. In FIG. 39, the tilt angle of 0° represents the case where the direction of the growth axis of the GaN layer is aligned with the direction of the substrate axis. As seen from FIG. 39, the tilt angle of the growth axis of the GaN layer with respect to the substrate axis of the sapphire substrate 51 monotonously decreases with an increase of the thickness of the low-temperature GaN buffer layer 52. The sign of the tilt angle is reversed from positive to negative at the thickness of the low-temperature GaN buffer layer 52 being about 15 nm.

Figure 40:
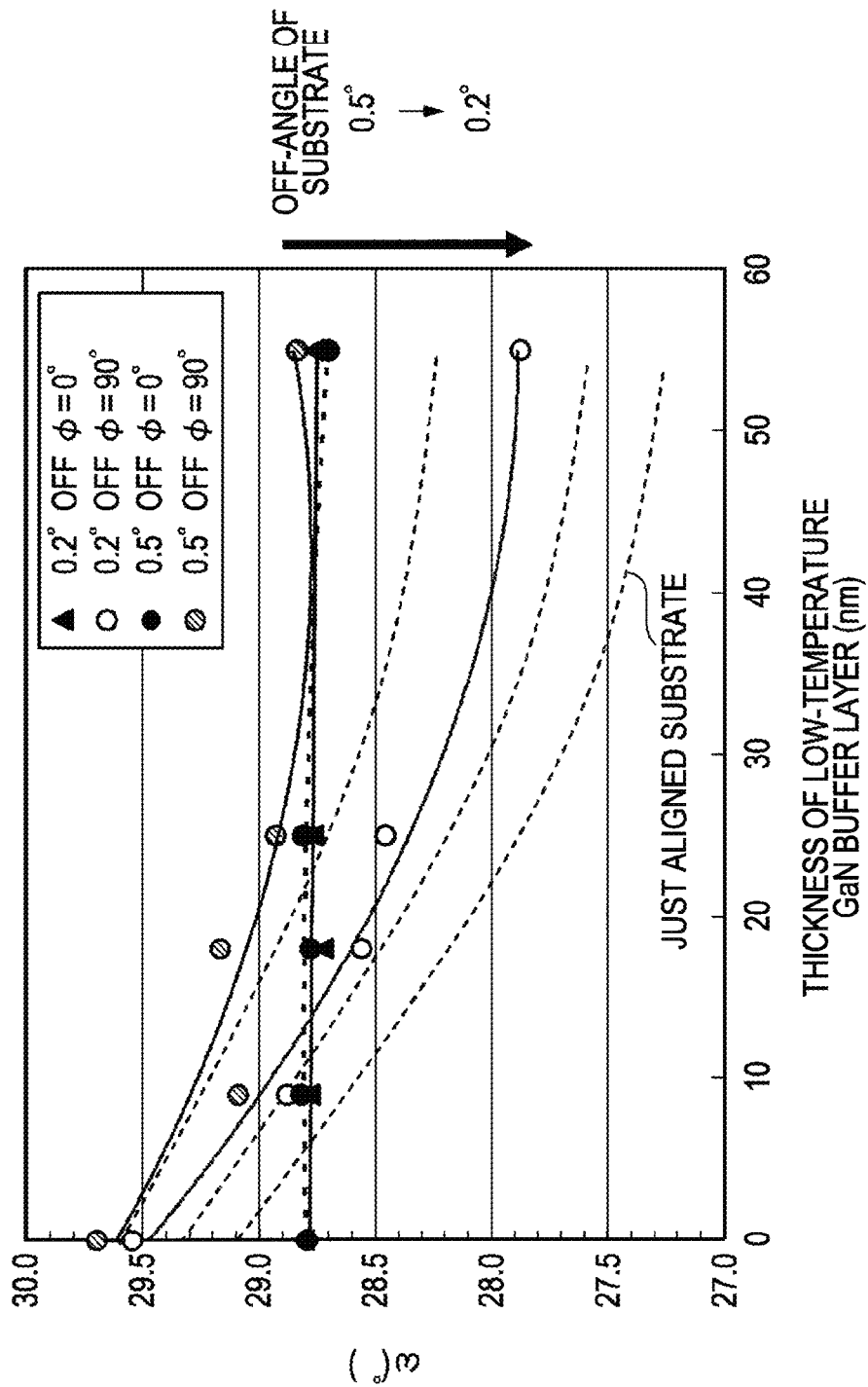
FIG. 40 is a graph illustrating changes in angle of the tilt, with respect to the substrate axis, of the growth axis of each of the GaN layers grown on the sapphire substrates, which have various off-angles, according to the fifth embodiment of the present invention with interposition of the low-temperature GaN buffer layer therebetween, depending on the thickness of the low-temperature GaN buffer layer.

FIG. 40 plots changes in ω depending on the thickness of the low-temperature GaN buffer layer 52 at φ=90° and φ=0° when the sapphire substrates 51 having different off-angles are used. As seen from FIG. 40, when the off-angle of the sapphire substrate 51 is changed, the tilt of the growth axis of the GaN layer is changed corresponding to a tilt of the off-direction. The change in the tilt angle of the growth axis of the GaN layer depending on the off-angle is about twice the difference of the off-angle.

Figure 41:
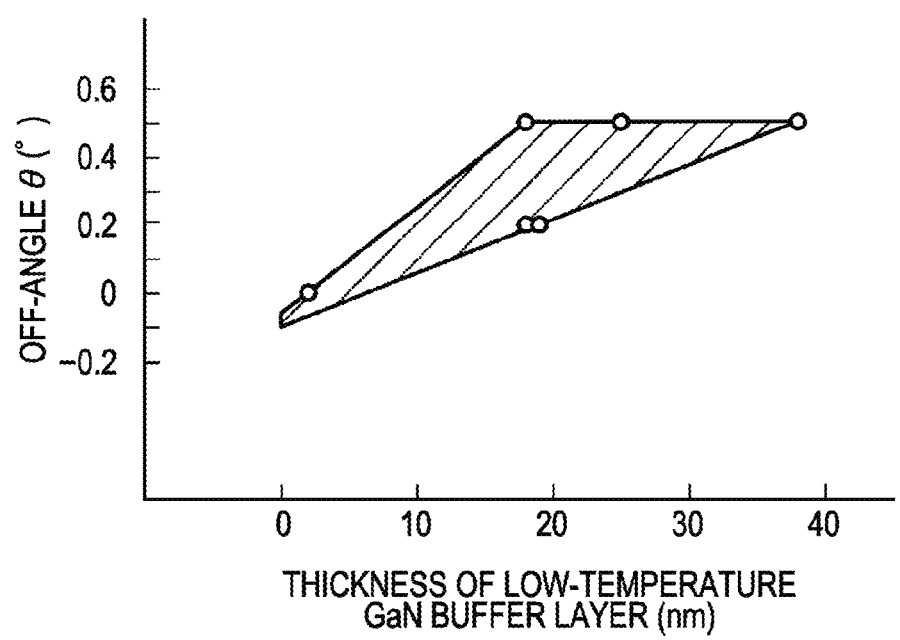
FIG. 41 is a graph illustrating the relationship between the thickness t of the low-temperature GaN buffer layer, which is grown on the sapphire substrate according to the fifth embodiment of the present invention, and the off-angle θ of the sapphire substrate.
Figure 42A:
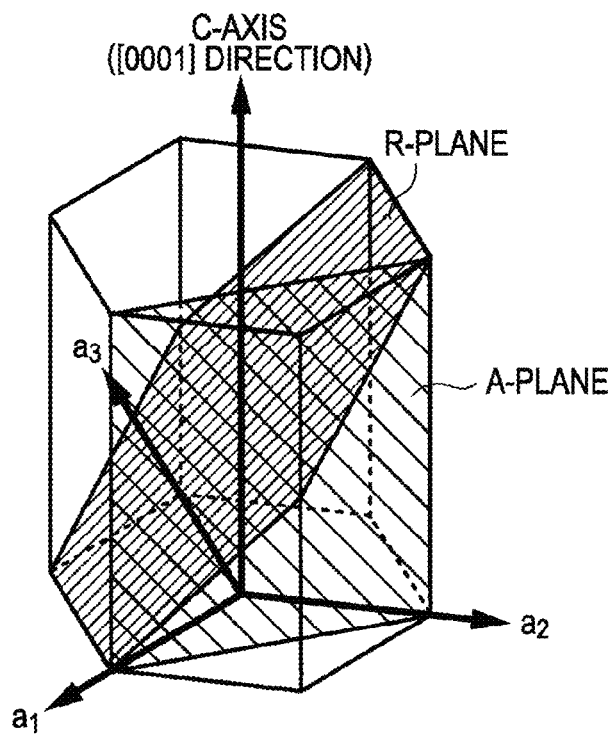
FIGS. 42A and 42B are illustrations representing several crystal planes and crystal orientations of a sapphire crystal.
Figure 42B:
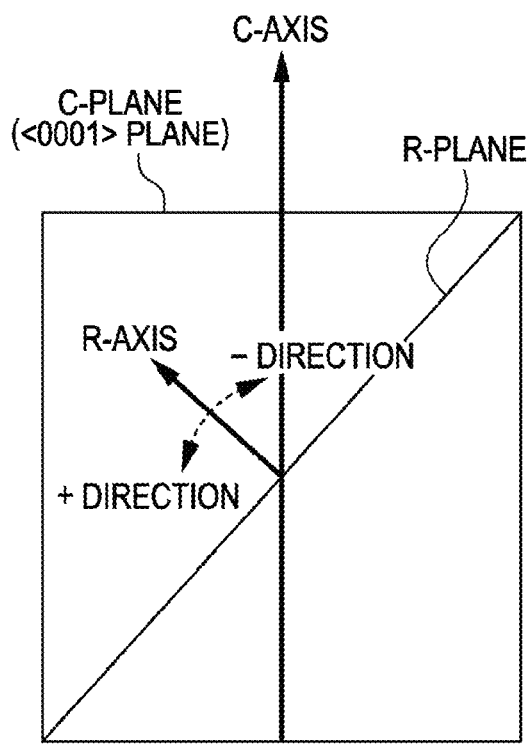

FIG. 41 illustrates the relationship between the thickness t of the low-temperature GaN buffer layer 52 and the off-angle θ of the sapphire substrate 51. In FIG. 41, a region on a tθ-plane, which is defined by the following inequalities, is hatched.

$$\theta \leq 0.031t - 0.063 \quad (1)$$

$$\theta \geq 0.016t - 0.1 \quad (2)$$

$$\theta \leq 0.5 \quad (3)$$

$$\theta \geq -0.1 \quad (4)$$

$$t > 0 \quad (5)$$

Herein, the inequalities (1) and (2) are obtained as follows. As illustrated in FIGS. 19A to 19D and FIGS. 20A to 20D, when the off-angle θ of the sapphire substrate 51 is 0.5°, the GaN layer superior in both surface flatness and crystallinity is obtained on condition the thickness t of the low-temperature GaN buffer layer 52 is in the range of 18 to 38 nm. Conversely speaking, it can be considered that when the off-angle θ of the sapphire substrate 51 is 0.5°, a lower limit of a range of the thickness t of the low-temperature GaN buffer layer 52 in which the GaN layer superior in both surface flatness and crystallinity can be reliably obtained is 18 nm and an upper limit of the range is 38 nm. Next, as illustrated in FIGS. 18A to 18D and FIGS. 19A to 19D, when the off-angle θ of the sapphire substrate 51 is 0.2°, the surface flatness and the crystallinity of the GaN layer is not superior when the thickness t of the low-temperature GaN buffer layer 52 is not less than 25 nm. However, the GaN layer superior in both surface flatness and crystallinity is obtained when the thickness t is 18 nm, i.e., at minimum. Further, as illustrated in FIGS. 13E, 14E, 15E and 16E, when the off-angle θ of the sapphire substrate 51 is 0.2°, the GaN layer superior in both surface flatness and crystallinity is obtained even when the thickness t of the low-temperature GaN buffer layer 52 is 19 nm. Accordingly, it can be considered that when the off-angle θ of the sapphire substrate 51 is 0.2°, an upper limit of a range of the thickness t of the low-temperature GaN buffer layer 52 in which the GaN layer superior in both surface flatness and crystallinity can be reliably obtained is 19 nm. Next, when the off-angle θ of the sapphire substrate 51 is 0°, i.e., when the sapphire substrate 51 is a substrate just aligned (i.e., an R-plane sapphire substrate), a lower limit of a range of the thickness t of the low-temperature GaN buffer layer 52 in which the GaN layer superior in both surface flatness and crystallinity can be reliably obtained is determined as follows. As seen from a data plot curve, illustrated in FIG. 40, representing the case where the off-angle θ of the sapphire substrate 51 is 0.2°, the tilt angle of the growth axis with respect to the substrate axis can be held small unless ω exceeds 29.0°. Looking at a data plot curve (estimated), illustrated in FIG. 40, when the off-angle θ of the sapphire substrate 51 is 0°, the thickness t of the low-temperature GaN buffer layer 52 at ω=29.0° is read as about 2 nm. It can be hence considered that when the off-angle θ of the sapphire substrate 51 is 0°, a lower limit of a range of the thickness t of the low-temperature GaN buffer layer 52 in which the GaN layer superior in both surface flatness and crystallinity can be reliably obtained is about 2 nm.

From the above discussions, a linear line passing a point (18, 0.5) and a point (2, 0) on the tθ-plane is regarded as providing the lower limit of the thickness t of the low-temperature GaN buffer layer 52 with respect to the off-angle θ. The linear line providing the lower limit of the thickness t can be expressed by θ=0.31t−0.063 through simple calculation. Likewise, a linear line passing a point (38, 0.5) and a point (19, 0.2) on the tθ-plane is regarded as providing the upper limit of the thickness t of the low-temperature GaN buffer layer 52 with respect to the off-angle θ. The linear line providing the upper limit of the thickness t can be expressed by θ=0.016t−0.1. In addition, θ at t=0 is given as −0.1° from the expression of θ=0.016t−0.1, which represents the linear line providing the upper limit of the thickness t.

Judging from all the points discussed above, it can be considered that the GaN layer superior in both surface flatness and crystallinity can be reliably obtained if the point (t, θ) on the tθ-plane is present within the region defined by the inequalities (1) to (5).

The region defined by the inequalities (1) to (5) is to be understood as indicating the fact that the GaN layer superior in both surface flatness and crystallinity can be reliably obtained if the point (t, θ) is present within the relevant region, but not indicating the fact that the GaN layer superior in both surface flatness and crystallinity is not reliably obtained unless the point (t, θ) is present within the relevant region. As illustrated in FIGS. 19A to 19D, for example, when the off-angle θ is 0.5°, the GaN layer superior in both surface flatness and crystallinity can be obtained even if the thickness t of the low-temperature GaN buffer layer 52 is 25 nm that is outside the relevant region.

While the embodiments and the examples of the present invention have been described in detail above, the present invention is not limited to the above-described embodiments and the examples, and it may be variously modified based on the technical concept of the present invention.

For example, the numerical values, the materials, the structures, the arrangements, the shapes, the substrates, the starting materials, the processes, etc., which have been mentioned above in the first to fifth embodiments and EXAMPLES 1 and 2, are given only by way of illustrations. Other numerical values, materials, structures, arrangements, shapes, substrates, starting materials, processes, etc. than those described above may also be used as the occasion necessitates.

The present application contains subject matter related to that disclosed in Japanese Priority Patent Application JP 2009-245160 filed in the Japan Patent Office on Oct. 26, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device, the method comprising:
    growing a nitride-based group III-V compound semiconductor layer, which forms a device structure on a substrate, directly on and in contact with a principal surface of the substrate without growing a buffer layer between the substrate and the nitride-based group III-V compound semiconductor layer, the substrate being made of a material with a hexagonal crystal structure and having the principal surface oriented off at an angle of not less than −0.5° and not more than 0° from an R-plane with respect to a direction of a C-axis.

2. The method for manufacturing the semiconductor device according to claim 1, wherein the principal surface is oriented off at an angle of not less than −0.5° and not more than −0.2° from the R-plane with respect to the direction of the C-axis.

3. The method for manufacturing the semiconductor device according to claim 2, wherein the substrate is made of sapphire, SiC, α-ZnS, ZnO, or a nitride-based group III-V compound semiconductor.

4. The method for manufacturing the semiconductor device according to claim 3, wherein the semiconductor device is a light emitting diode, a semiconductor laser, or an electron transit device.

5. A semiconductor device comprising:
    a substrate made of a material with a hexagonal crystal structure and having a principal surface that is oriented off at an angle of not less than −0.5° and not more than 0° from an R-plane with respect to a direction of a C-axis; and
    a nitride-based group III-V compound semiconductor layer grown directly on and in contact with the principal surface of the substrate without growing a buffer layer between the substrate and the nitride-based group III-V compound semiconductor layer, and forming a device structure on the substrate.

6. The semiconductor device according to claim 5, wherein the principal surface that is oriented off at an angle of not less than −0.5° and not more than −0.2° from the R-plane with respect to the direction of the C-axis.

7. The semiconductor device according to claim 6, wherein the substrate is made of sapphire, SiC, α-ZnS, ZnO, or a nitride-based group III-V compound semiconductor.

8. The semiconductor device according to claim 7, wherein the semiconductor device is a light emitting diode, a semiconductor laser, or an electron transit device.

9. The semiconductor device according to claim 1, wherein the nitride-based group III-V compound semiconductor layer is a GaN layer.

10. The semiconductor device according to claim 1, wherein the nitride-based group III-V compound semiconductor layer is one of a GaN layer, an AlGaN layer, an AlGaInN layer and an InGaN layer.

* * * * *